(12) United States Patent
Ajika et al.

(10) Patent No.: US 8,017,994 B2
(45) Date of Patent: Sep. 13, 2011

(54) NONVOLATILE SEMICONDUCTOR MEMORY

(75) Inventors: Natsuo Ajika, Hyogo (JP); Shoji Shukuri, Hyogo (JP); Masaaki Mihara, Hyogo (JP); Moriyoshi Nakashima, Hyogo (JP)

(73) Assignee: Genusion, Inc., Amagasaki-shi (JP)

( * ) Notice: Subject to any disclaimer, the term of this patent is extended or adjusted under 35 U.S.C. 154(b) by 170 days.

(21) Appl. No.: 12/499,220

(22) Filed: Jul. 8, 2009

(65) Prior Publication Data

US 2009/0310409 A1     Dec. 17, 2009

Related U.S. Application Data

(63) Continuation of application No. 11/550,335, filed on Oct. 17, 2006, now Pat. No. 7,573,742, which is a continuation-in-part of application No. 10/598,853, filed on Oct. 12, 2006, now Pat. No. 7,515,479.

(30) Foreign Application Priority Data

Nov. 1, 2004  (JP) ................. 2004-318333
Jan. 21, 2005  (JP) ................. 2005-014780
Nov. 1, 2005  (WO) ............ PCT/JP2005/020063

(51) Int. Cl.
*H01L 29/792* (2006.01)
(52) U.S. Cl. ............... 257/324; 257/314; 257/E29.309
(58) Field of Classification Search .......... 257/314–316, 257/324, E29.309, E29.3
See application file for complete search history.

(56) References Cited

U.S. PATENT DOCUMENTS

| 5,687,118 | A | 11/1997 | Chang |
| 5,745,417 | A | 4/1998 | Kobayashi et al. |
| 5,877,524 | A | 3/1999 | Oonakado et al. |
| 5,898,606 | A | 4/1999 | Kobayashi et al. |
| 6,172,908 | B1 | 1/2001 | Cappelletti et al. |
| 7,167,392 | B1 | 1/2007 | Poplevine et al. |
| 7,339,229 | B2 | 3/2008 | Wang et al. |
| 7,411,829 | B2 | 8/2008 | Diorio et al. |
| 2005/0127428 | A1* | 6/2005 | Mokhlesi et al. ............. 257/315 |
| 2006/0140004 | A1 | 6/2006 | Shukuri et al. |

FOREIGN PATENT DOCUMENTS

| JP | 09-008153 | 1/1997 |
| JP | 09-246404 | 9/1997 |
| JP | H9-260518 | 10/1997 |

OTHER PUBLICATIONS

Natsuo Ajika, et al., Development of Flash Memory Written at 100MB/s Enabling NOR-level Fast Readout, Nikkei Electronics, Jun. 11, 2006, Japan.

* cited by examiner

*Primary Examiner* — Anh Phung
*Assistant Examiner* — Allison P Bernstein
(74) *Attorney, Agent, or Firm* — The Marbury Law Group PLLC

(57) ABSTRACT

A hot electron (BBHE) is generated close to a drain by tunneling between bands, and it data writing is performed by injecting the hot electron into a charge storage layer. When Vg is a gate voltage, Vsub is a cell well voltage, Vs is a source voltage and Vd is a drain voltage, a relation of Vg>Vsub>Vs>Vd is satisfied, Vg−Vd is a value of a potential difference required for generating a tunnel current between the bands or higher, and Vsub−Vd is substantially equivalent to a barrier potential of the tunnel insulating film or higher.

20 Claims, 31 Drawing Sheets

FIG.1
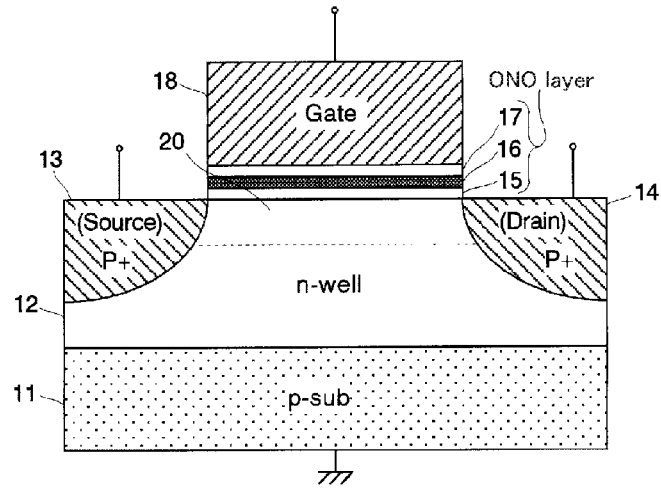
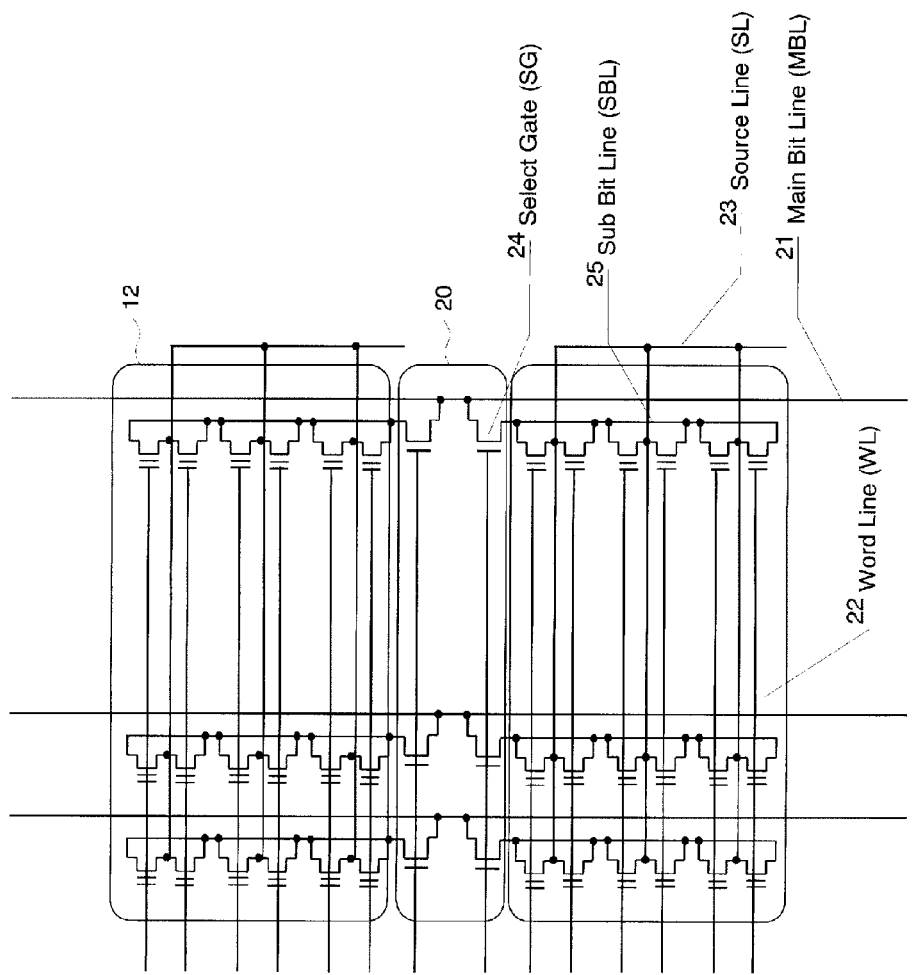
FIG. 2

|  | | Program | Prg-verify | Erase(tn) | Erase(hh) | Read |
|---|---|---|---|---|---|---|
| selected | Main-BL | GND | VCC | VCC | VCC | GND |
|  | SG | -2.2V | -2.2V | VCC | VCC | -2.2V |
|  | Sub-BL | GND | VCC | open | open | GND |
|  | WL | 10V | -5V | -13V | -13V | -2.2V |
|  | Source | VCC | GND | VCC | -4V | VCC |
|  | Cell-well | 4V | 4V | VCC | -1V | VCC |
|  | SG-well | VCC | VCC | VCC | VCC | VCC |
| Un-selected | Main-BL | VCC | VCC | VCC | VCC | VCC |
|  | SG | VCC | VCC | VCC | VCC | VCC |
|  | Sub-BL | open | open | open | open | open |
|  | WL | VCC | VCC | VCC | VCC | VCC |
|  | Source | VCC | VCC | VCC | VCC | VCC |
|  | Cell-well | VCC | VCC | VCC | VCC | VCC |
|  | SG-well | VCC | VCC | VCC | VCC | VCC |
|  | sub | GND | GND | GND | GND | GND |

FIG.3

(A)
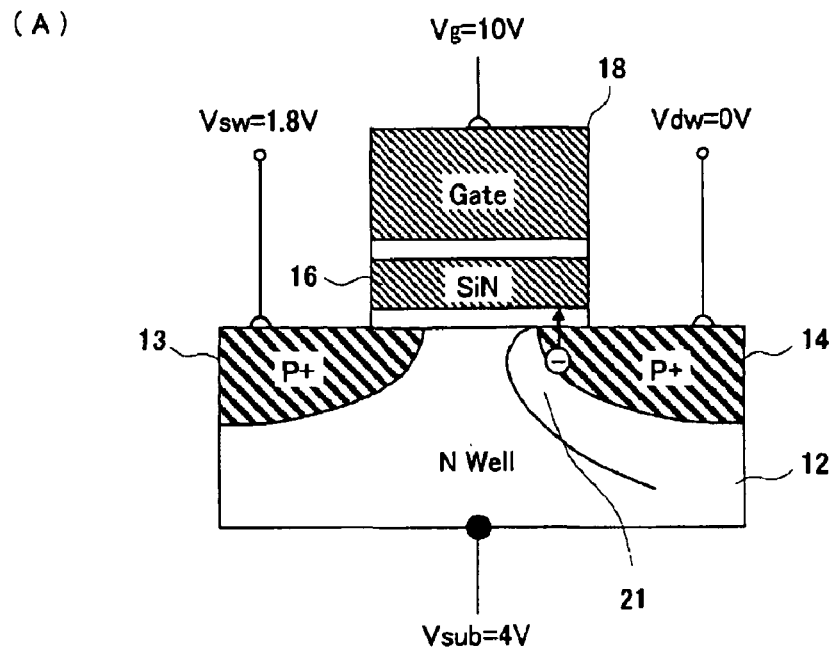
(B)
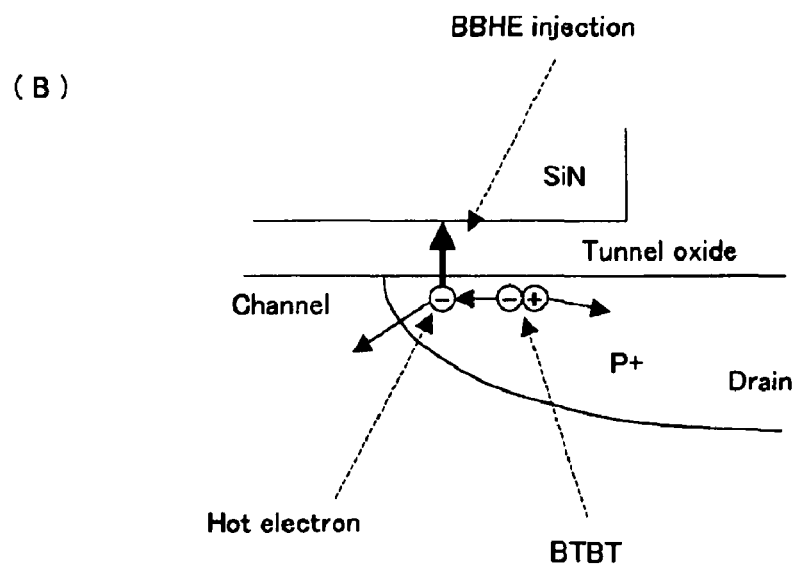
FIG.6

NONVOLATILE SEMICONDUCTOR MEMORY

RELATED APPLICATIONS

This application is a continuation of and claims the benefit of priority to U.S. patent application Ser. No. 11/550,335 entitled "Nonvolatile Semiconductor Memory" filed on Oct. 17, 2006, now U.S. Pat. No. 7,573,742, which is a continuation-in-part of U.S. application Ser. No. 10/598,853 filed on Sep. 13, 2006, now U.S. Pat. No. 7,515,479, which claims the benefit of priority to PCT Application PCT/JP2005/020063 filed on Nov. 1, 2005.

TECHNICAL FIELD

The present invention relates to a nonvolatile semiconductor storage device which realizes scaling of gate lengths of nonvolatile semiconductor memory cells, and method for writing therein.

BACKGROUND OF THE INVENTION

Recently, concern over the limit of scaling of a NOR type flash memory for code storage having a capability of random access, is increasing.

According to the technology prediction by ITRS (International Technology Roadmap for Semiconductors) in 2004, even in 2018 when 20 nm semiconductor process technology is predicted to be utilized, it is said to be difficult to realize gate lengths of 130 nm for memory cells of a NOR type flash memory.

One of the main reasons why gate lengths of a NOR type flash memory can not scale is that Channel Hot Electron (CHE) injection is used for writing operations. In order to generate Channel Hot Electron efficiently, a relatively large potential difference is required, which is not less than a barrier voltage of tunnel insulating layer (silicon oxide layer), across a source and a drain of a memory cell. Due to a relatively large depletion layer formed from the drain toward the source of the memory cell caused by the potential difference, scaling of gate lengths will cause problems such that the drain and the source will be connected by the depletion layer (punch through) and generation of Hot Electrons will be prevented.

In order to deal with the problem noted above, a reduction in the potential difference Vds across a source and a drain by using materials for tunnel insulating layers which have lower barrier voltages than that of silicon oxide layer is proposed (see Patent Document No. 1). Furthermore, a NOR type flash memory which applies a method for writing operation other than Channel Hot Electron Injection is also proposed (see Patent Document No. 2). Patent Document No. 1: Japanese Patent Publication 2001-237330, Patent Document No. 2: Japanese Patent Publication H09-8153.

DISCLOSURE OF THE INVENTION

Problem to be Solved by the Invention

Due to the fact that the carrier leakage characteristic of said material is worse than that of silicon oxide layer, the technology described in the Patent Document No. 1 is so far not practiced for tunnel insulating layers of nonvolatile semiconductor memories.

Furthermore, the technology described in the Patent Document No. 2 is related to a writing by band to band induced Hot Electron injection (BBHE), instead of Channel Hot Electron Injection, which requires the source/drain potential difference Vds to be relatively large (e.g. 4V) in order to prevent the energy of hot electrons from being less than the potential barrier of the tunnel insulating layer which restricts the scaling of the gate length.

An object of the present invention is to provide a nonvolatile semiconductor memory device which can scale gate lengths of memory cells by reducing potential difference Vds across a source and a drain and method for writing therein.

Method to Solve the Problem (1) A method for writing bit data to a nonvolatile semiconductor memory device, said nonvolatile semiconductor memory device comprising,
an n type well formed in a semiconductor substrate,
a source and a drain of p+ regions formed in the surface of said n type well with a predetermined interval,
a channel region formed between said source and said drain,
a charge accumulation layer of a floating gate, a nanocrystal layer, a nonconductive charge trap layer such as a silicon nitride layer, and so on, formed above said channel region via a tunnel insulating layer, and
a gate electrode formed above said charge accumulation layer via an insulating layer,
said method comprising:
applying Vg, Vsub, Vs and Vd to the gate electrode, the n type well, the source and the drain respectively during writing, the Vg, the Vsub, the Vs and the Vd being in a relationship of "Vg>Vsub>Vs>Vd" and "Vg−Vd" being not less than an electrical potential difference necessary to generate band to band tunneling current at said channel region,
thereby generating hot electrons near the drain by band to band tunneling, and injecting said hot electrons into said charge accumulation layer to write the bit data.

(2) A method for writing bit data to a nonvolatile semiconductor memory device, said nonvolatile semiconductor memory device comprising,
a p type well formed in a semiconductor substrate,
a source and a drain of n+ regions formed in the surface of said p type well with a predetermined interval,
a channel region formed between said source and said drain,
a charge accumulation layer of a floating gate, a nanocrystal layer, a nonconductive charge trap layer such as a silicon nitride layer, and so on, formed above said channel region via tunnel insulating layer, and
a gate electrode formed above said charge accumulation layer via an insulating layer,
said method comprising,
applying Vg, Vsub, Vs, and Vd to the gate electrode, the p type well, the source and the drain respectively during writing, the Vg, the Vsub, the Vs, and the Vd being in a relationship of "Vg<Vsub<Vs<Vd" and "Vd−Vg" being not less than an electrical potential difference necessary to generate band to band tunneling current at said channel region,
thereby generating hot holes near the drain by band to band tunneling, and
injecting said hot holes into said charge accumulation layer to write the bit data.

(3) Two voltages from said Vg, Vsub, Vs and Vd are supplied from an external power supply.

(4) At least Vd among said Vg, Vsub, Vs and Vd is supplied from an external power supply.

(5) Vs and Vd among said Vg, Vsub, Vs and Vd are supplied from an external power supply.

(6) Said Vs is a power supply voltage and Vd is a ground voltage.

(7) The memory cells written by method (1) or (2), and arrayed by connecting in a NOR type or in a NAND type.

EFFECTS OF THE INVENTION

According to the present invention, setting the voltages in a relationship of "Vg>Vsub>Vs>Vd (p-channel)" or "Vg<Vsub<Vs<Vd (n-channel)", i.e., setting the source voltage Vs between the cell well voltage Vsub and the drain voltage Vd, causes hot electrons or hot holes to be generated efficiently by band to band tunneling, minimizes the potential difference between the source and the drain, and therefore scales the gate length. For fast writing, the potential difference of the cell well voltage Vsub and the drain voltage Vd is preferred to be equivalent or not less than the barrier voltage of the tunneling insulating layer.

Furthermore, according to the present invention, the number of voltage stepping-up circuits to generate the voltages in a chip can be reduced by supplying any one of the voltages Vg, Vsub, Vs and Vd from the external power supply. Therefore, a chip area can be scaled and the cost of a nonvolatile semiconductor memory device can be reduced.

Particularly, supplying the drain voltage Vd, which consumes the largest amount of current during writing, from an external power supply, may reduce the capability to supply the current of the voltage stepping-up circuits in the chip, and a chip area can be further scaled.

Furthermore, according to the present invention, by applying an appropriate back gate voltage to the cell well, the source voltage Vs can be the power supply voltage and the drain voltage Vd can be the ground voltage, and allows two of the four voltages to be supplied from the external supply and allows the remaining two voltages (the gate voltage Vg, the cell well voltage Vsub) to be voltages with the same polarity to the power supply voltage.

BRIEF DESCRIPTION OF DRAWINGS

FIG. 1 shows a schematic configuration of a p-channel MONOS memory cell implementing the present invention.

FIG. 2 is an equivalent circuit showing the architecture in the case of the p-channel MONOS memory cells arranged in XY to form a NOR-connected array.

FIG. 3 shows a potential distribution for the NOR-connected array during programming, verifying, erasing and reading out.

FIG. 6 shows a potential distribution of a single memory cell and a principle of BTHE injection during programming.

DESCRIPTION OF REFERENCE NUMERALS

Figure 4:
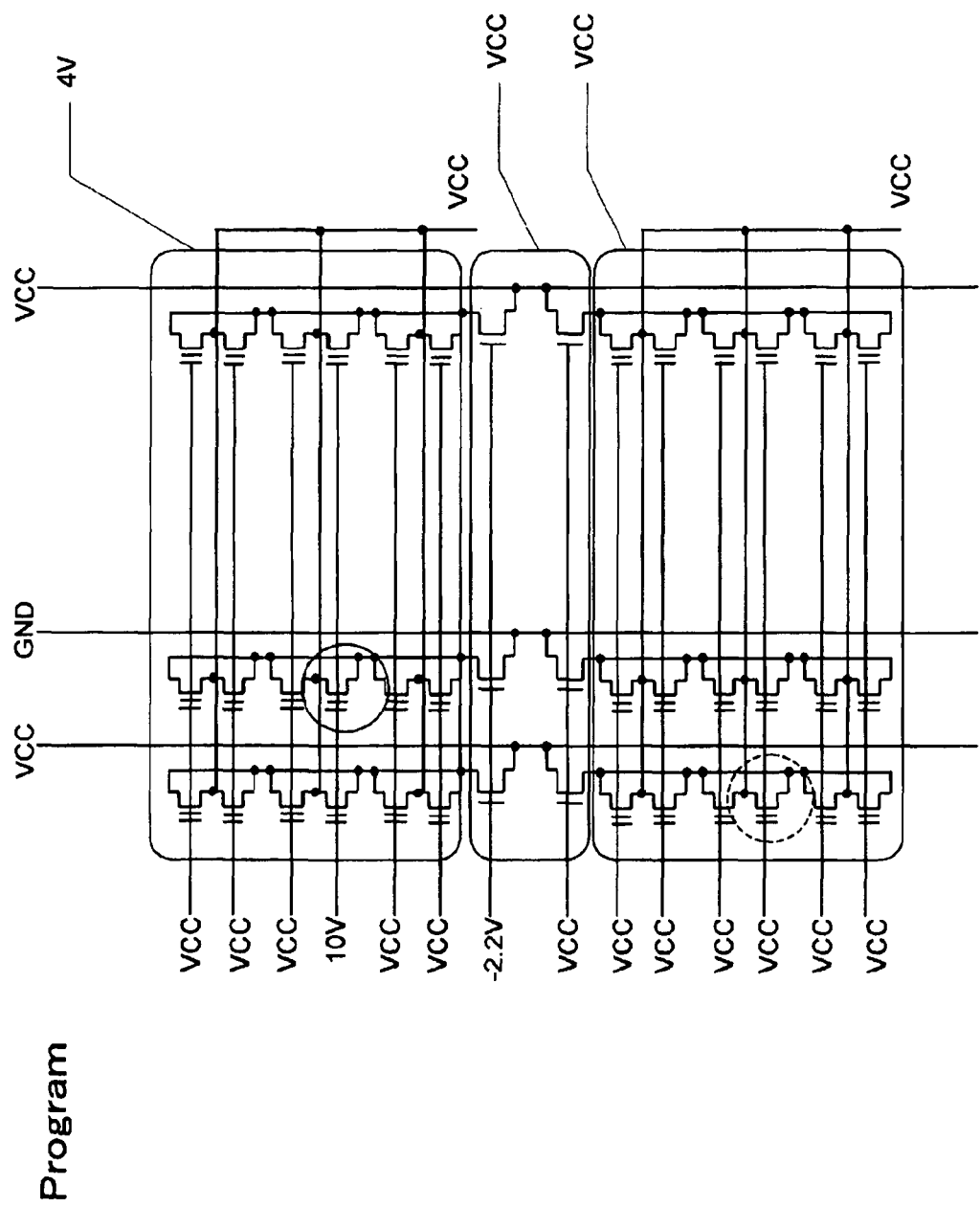
FIG. 4 shows a potential distribution in the equivalent circuit during programming.

11 . . . p-type semiconductor substrate
12 . . . n-type well (cell well)
13 . . . source (p+ region)
14 . . . drain (p+ region)
15 . . . tunneling insulating layer
16 . . . channel trap layer (nitride layer)
17 . . . upper insulating layer
18 . . . gate
20 . . . selection gate well (n-type well)
21 . . . main bit line
22 . . . word line
23 . . . source line
24 . . . selection gate
25 . . . sub bit line

PREFERRED EMBODIMENTS TO IMPLEMENT THE PRESENT INVENTION

The embodiments of the invention will be explained with reference to the accompanying drawings. FIG. 1 shows a schematic configuration of the p-channel MONOS memory cell implementing the present invention. The memory cell has an n type well (cell well) 12 formed in a semiconductor substrate 11, a p+ region (source) 13 and a p+ region (drain) 14 formed near the surface of the n type well with a predetermined interval, a channel region 20 formed between the two p type regions 13 and 14, and an ONO layer and a gate electrode 18 formed above the channel region 20 and to cover the channel region 20.

The ONO layer consists of a tunnel insulating layer 15 made by silicon oxide, a charge trap layer 16 to accumulate injected charges made by silicon nitride and an insulating layer 17 made by silicon oxide. The thicknesses of these three layers: the thickness of the tunnel insulating layer 15 is approximately 2.5~5 nm, the thickness of the charge trap layer 16 is approximately 10 nm, and the thickness of the insulating layer 17 is approximately 5 nm. The gate electrode 18 is made by poly-silicon. The gate length can be considerably shortened to realize a length not more than 60 nm by distributing writing potentials which will be explained hereinafter.

Next, the architecture of the nonvolatile semiconductor memory device wherein said memory cells are connected to be a NOR-connected array is explained by referring to FIG. 2. Two of the cell wells 12 are paired in this nonvolatile semiconductor memory device. Memory cells of 1 kB at=8 k (8192) at x direction by 64 at y direction=512 k (524288) are formed in the cell well. The number of main bit lines is 8 k, each of the main bit lines are connected to one of the sub bit lines 25 of the two cell wells 12 via a select gate 24. The 8 k main bit lines 21 are connected to latches respectively. The latch is used during program verifying and the like. The select gate 24 is formed in a select gate well (n type well) 20 which is different from the cell well 12 and the select gate is comprised of a p channel MOS transistor. The potential of the select gate well 20 is usually set at VCC (e.g. 1.8V). VCC is applied to the gate electrode of the select gate 24 when non-selected and −2.2 v is applied when selected. By applying −2.2 v and rendering the gate conductive, the main bit line 21 is connected to the sub bit line 25 which is connected to the drain of the respective memory cells. Word lines connect the gate electrodes of the respective memory cells in x direction. The 64 word lines are provided to cell wells 12 respectively. A source line is common for the 512 k memory cells in the respective memory cells.

The voltage VCC and GND (ground voltage) are supplied from a source supply circuit which is external to the memory cell.

The writing operation (program verify), reading out operation and erasing operation of the NOR-connected nonvolatile semiconductor memory device as shown in FIG. 2 are explained referring to FIG. 3 to FIG. 14. FIG. 3 to FIG. 14 show potential distributions and operational principles during writing (program verify), reading out and erasing operations.

In this nonvolatile semiconductor memory device, by reducing the source voltage lower than the cell well voltage Vsub to be close to the drain voltage Vd, by reducing the potential difference between the drain and the source and by applying an appropriate back gate voltage to the cell well (back gate effect) during writing by BBHE injections, the equivalent threshold voltage Vth (absolute value) is raised and the punch through is suppressed. Therefore, a cell structure which has the reduced gate length not more than 0.1 μm, for example 60 nm approximately, is realized Furthermore, by applying the appropriate back gate voltage to the cell well, the bit line, requiring the fastest operation, can operate between GND and VCC. Therefore, the control circuit for the bit line can be made by fast and positive VCC circuits, enabling fast operation and a simplified structure.

Firstly, the program operation of the writing operation is explained. Trapped electrons do not move in the layer due to the nitride layer which has low electro-conductivity used as the charge trap layer 16 and remain in the place where the electrons are trapped in the MONOS memory cell as previously stated. Writing (programming) in the memory cell is performed by injecting electrons into the charge trap layer 16. The injection of electrons is performed by BBHE injection by applying positive and negative high voltages to the gate electrode 18 and the drain 14 and the electrons are injected in the charge trap layer 16.

Injection of charges to the charge trap layer 16 is performed by the injection of hot electrons caused by band to band tunneling using a strong electrical field in a depletion layer generating a large potential difference between the electrode 18 at a positive potential and the drain 14 at a negative potential (BBHE: Band-to-Band tunneling induced Hot Electron). In order to control the drain (=bit line) within the positive potential, a positive back gate voltage is applied to the cell well 12. Therefore, the ground potential of the drain will be relatively negative.

Figure 5:
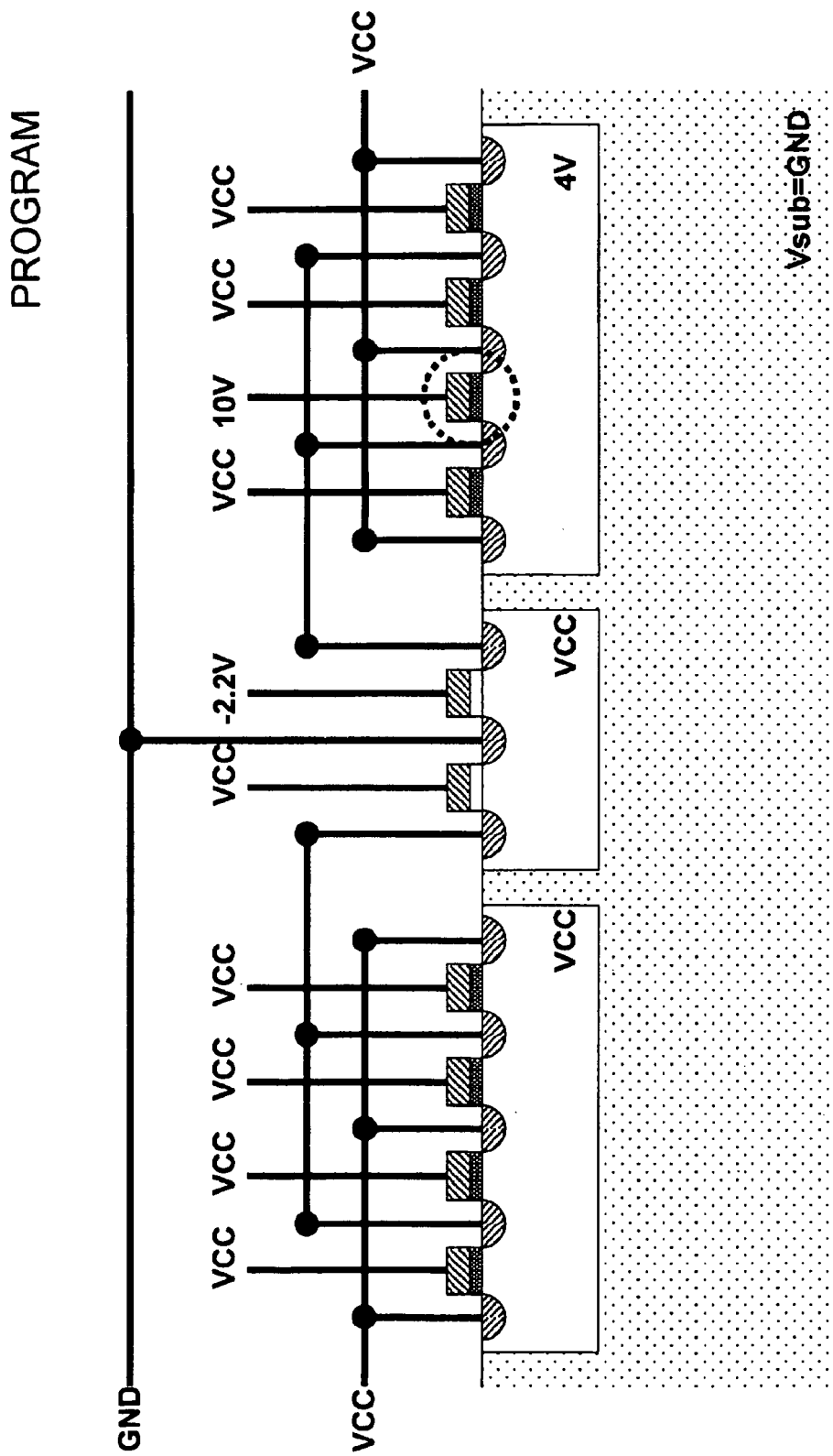
FIG. 5 shows a potential distribution in a cross sectional view during programming.

Specifically, as shown in FIG. 3, FIG. 4 and FIG. 5, +4V as the back gate voltage Vsub is applied to the cell well 12 and the drain 14 (bit line) is turned to ground potential (Vdw=0). 10V as the gate voltage Vgw is applied to the gate 18 (word line). At this time, VCC (=1.8V) is applied to the source 13 (source line).

FIG. 6 shows a potential distribution of a single memory cell during writing. By setting the potential distribution as above, the depletion layer 21 generates at the junction surface of the drain 14 and the cell well 12 and electron/hole pairs are generated by the band to band tunneling (BTBT) at the drain 14. The electrons are accelerated by the strong electrical field and become hot electrons with high energy. Parts of the hot electrons are pulled by the positive potential applied to gate electrode 18 and are injected to the charge trap layer 16 by traversing the tunnel insulating layer 15.

This injection of charges is performed when the area between the source 13 and the drain 14 is turned off, therefore an injection efficiency of approximately $10^{-2}$ is secured and a high injection efficiency of approximately $X\ 10^3$ compared with a conventional method of channel hot electrons may be obtained.

In this case, the source 13 is applied with VCC (e.g. 1.8V) and the potential difference between the source and the drain is approximately 1.8V. Even if the gate length is shortened, the depletion layer near the drain 14 does not extend to source 13 to become conductive (punch through). Furthermore, the cell well 12 is applied with the back gate voltage of 4V, which renders a back gate effect in which electrons discharged into the channel are pulled to the substrate to relatively increase the threshold voltage Vth (absolute value), suppressing the conduction during writing.

By applying the appropriate positive back gate voltage to the cell well 12 during programming as described above, the drain (bit line) can be controlled within 0V to VCC (positive potential). Therefore, the Y-peripheral circuits (for bit line) which requires fast operation during writing, can be made by a positive voltage circuit using high performance VCC transistors, thereby fast writing and simplification of circuit configurations are achieved.

The writings (the injection of the electrons) of the bits are repeated step by step with verifying until the threshold voltages Vth become predetermined voltages. Therefore, the threshold voltages of written bits are substantially the same and the cells are not depleted by too much electron injection.

Figure 7:
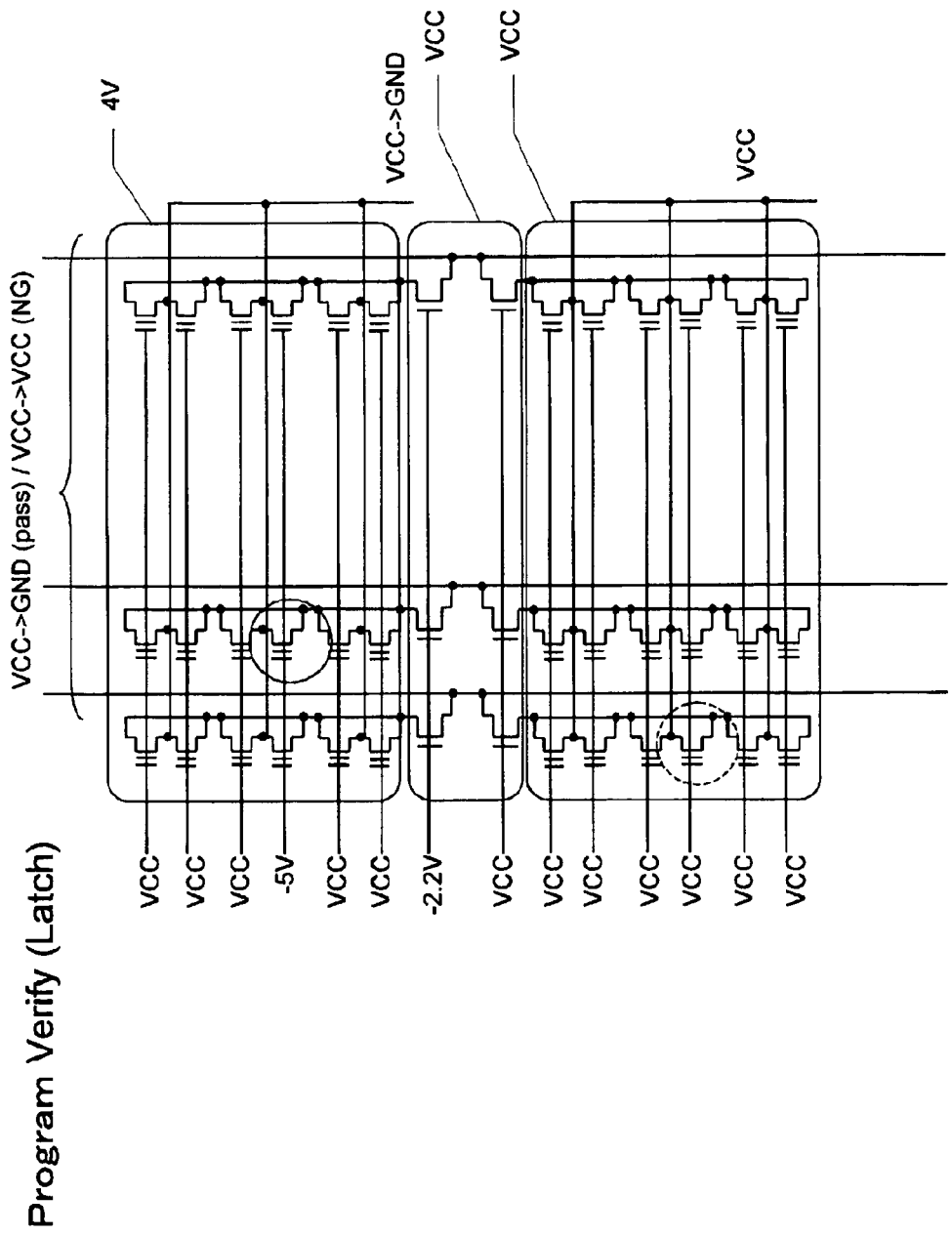
FIG. 7 shows a potential distribution in the equivalent circuit during verifying.
Figure 8:
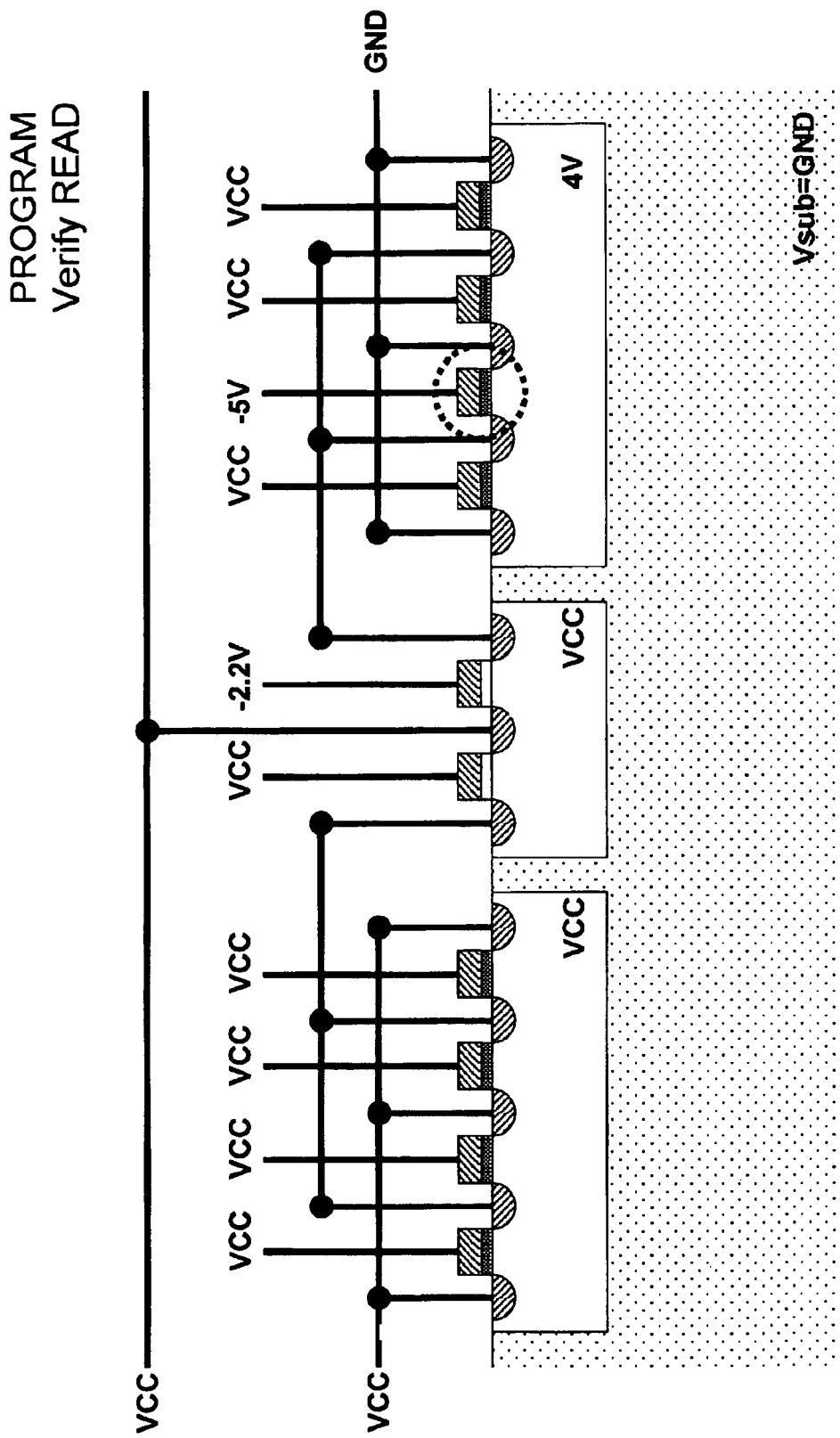
FIG. 8 shows a potential distribution in a cross sectional view during verifying.

Next, a verifying operation of the writing operation is explained by referring to FIG. 3, FIG. 7 and FIG. 8. The verifying is a repeated operation performed along with programming in order to confirm whether the threshold voltage Vth is at a predetermined voltage.

In order to realize fast writing, the operation switches from said programming to the verifying should be performed quickly. Due to the back gate voltage applied to the cell well 12 in the operation of said programming, it is difficult to quickly change the cell well voltage which has large parasitic capacitance toward VCC-4V during the programming/verifying switches. Therefore, the verifying is performed with the back gate voltage (4V) being applied to the cell well 12 in this embodiment. In the verifying operation, the word line 21 (the gate electrode 18) is set at a high voltage greater than the normal reading out voltage (−2.2V; which will be explained hereinafter) for example −5V, because the voltage of the cell well 12 remains at 4V. In this case, the source line 23 is driven to GND after the source line 23 and the bit lines 21 and 25 are charged to VCC. When the programming is finished, the bit lines 21 and 25 are discharged and become at GND because the channel becomes conductive. If the programming is not finished, the bit lines 21 and 25 remain at VCC. This potential of the bit line is latched and the bit line voltage for the next programming pulse application is determined based on this potential. Only for the bit line with VCC latched voltage electron injection will be performed again in the next programming pulse.

Thus, by performing verifying operation with the back gate voltage 4V being applied to the cell well 12, the programming/verifying switch is quickly done and fast writing of bits is realized.

On the other hand, a reading out operation is required to be faster than writing operation and the quick switching of not only the bit line but also the word line is necessary. The back gate voltage applied to the cell well 12 is set at normal voltage (VCC=1.8V) and the reading out voltage applied to the word line is set at −2.2V.

Figure 9:
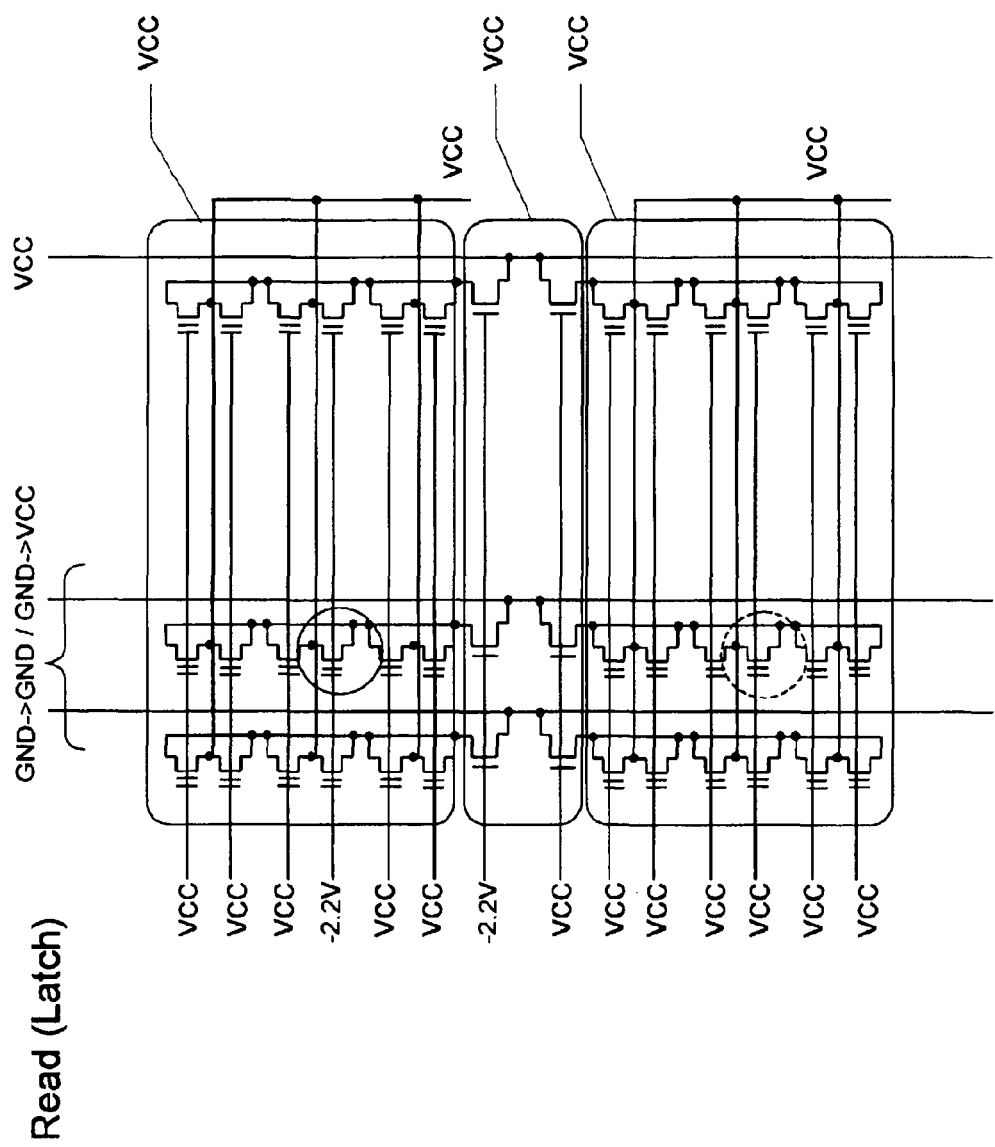
FIG. 9 shows a potential distribution in the equivalent circuit during reading out.
Figure 10:
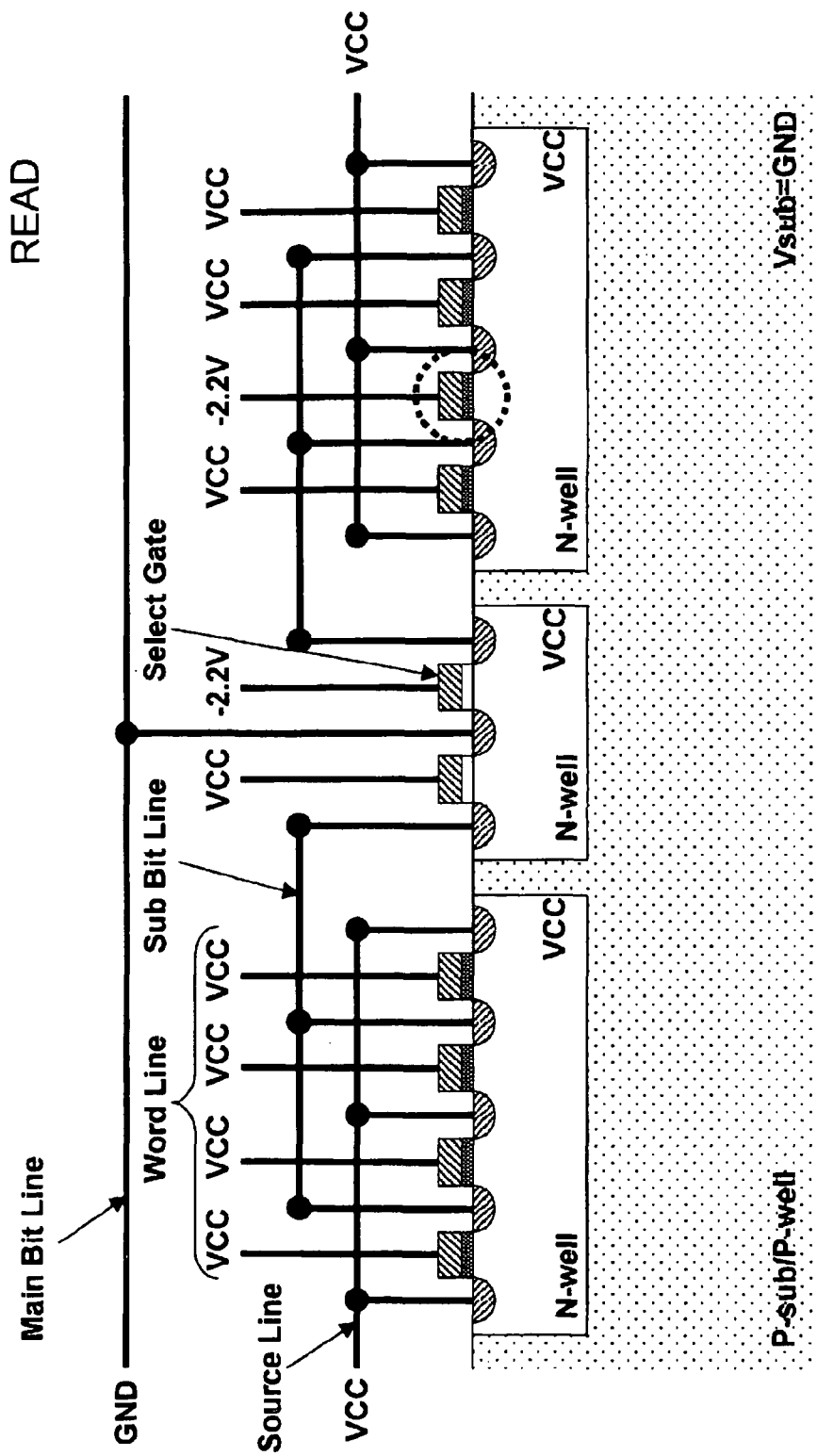
FIG. 10 shows a potential distribution in a cross sectional view during reading out.

Next, the reading out operation is explained by referring to FIG. 3, FIG. 9 and FIG. 10. In the reading out operation, VCC is applied to the cell well 12 as the back gate voltage and the source line 23 (source 13) is applied with VCC (=1.8V). The voltage of the word line 22 (gate 18), which is to be read out, is changed to read out voltage Vgr=−2.2 V from VCC after setting the bit line 22 and 25 (drain 14) to be read out at GND. Thus, when the cell is at the programmed state by this potential distribution, the bit lines 21 and 25 are raised to VCC and when the cell is at the un-programmed state, the bit lines 21 and 25 remain at GND.

Next, the erasing operation is explained. The methods for erasing may be a method for discharging by FN (Fowler-Nordheim) tunnel or a method for injecting by substrate hot hole.

Figure 11:
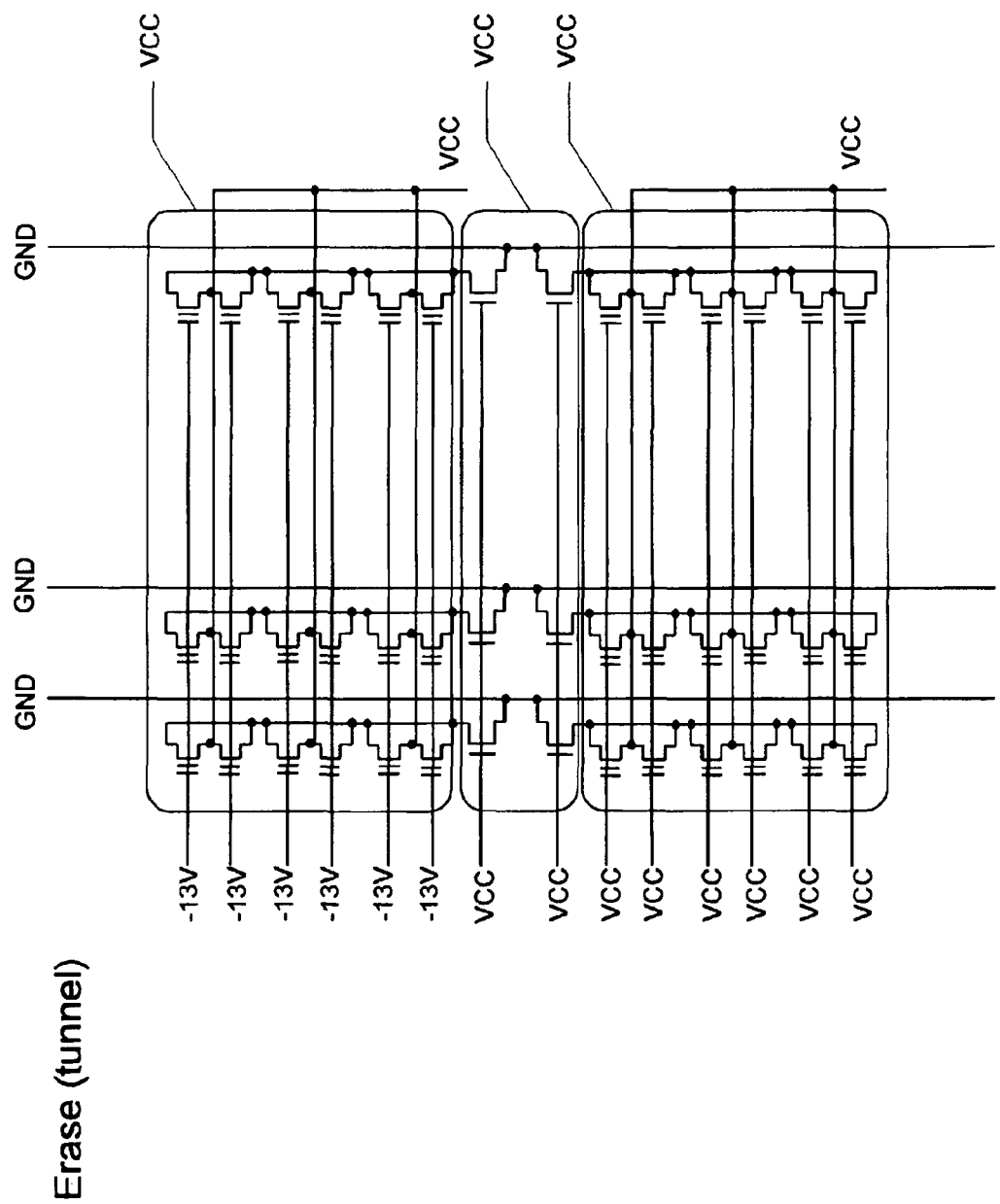
FIG. 11 shows a potential distribution in the equivalent circuit during erasing by FN tunneling.
Figure 12:
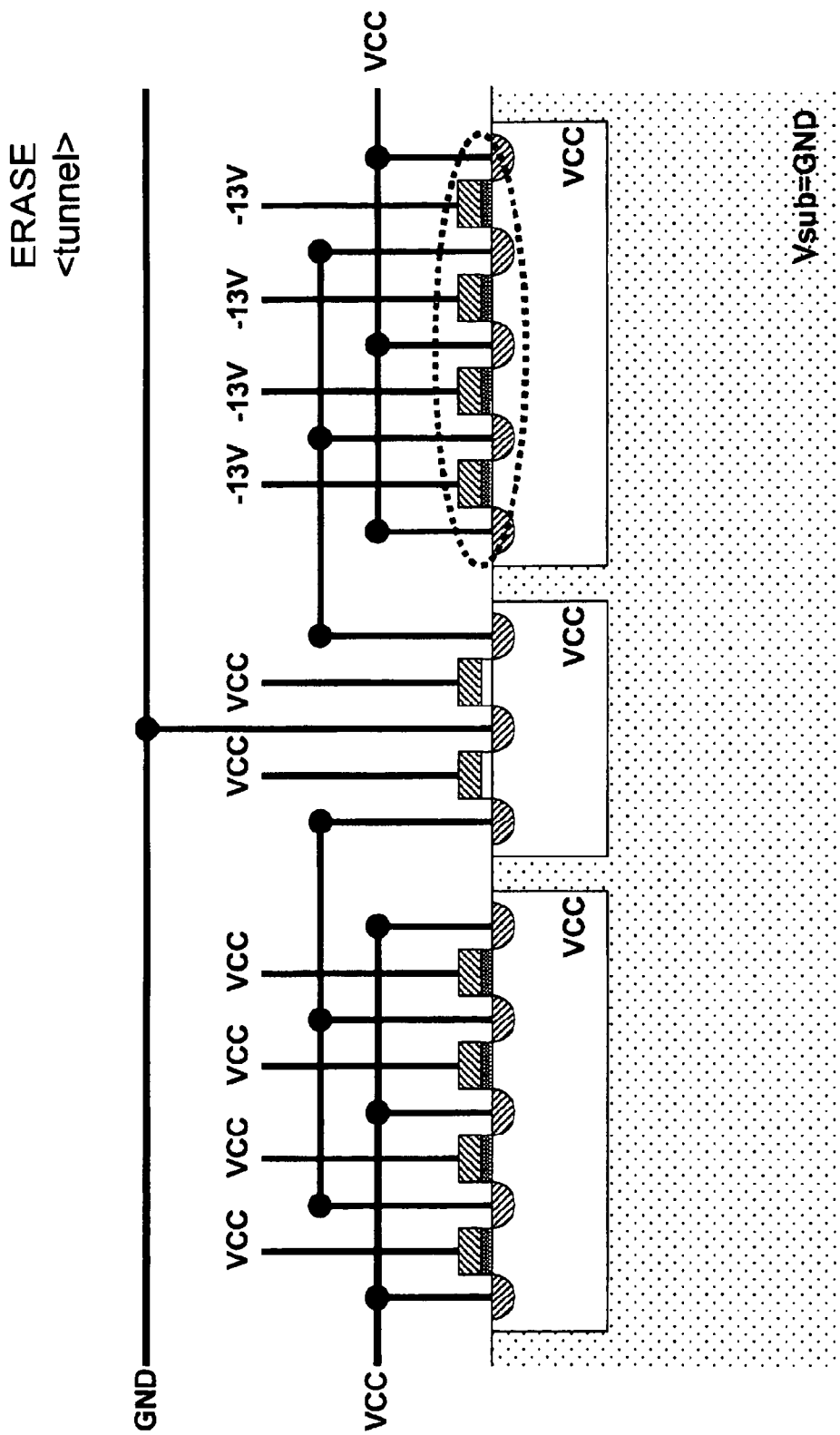
FIG. 12 shows a potential distribution in a cross sectional view during erasing by FN tunneling.

The discharging by FN tunnel is explained by referring to FIG. 3, FIG. 11 and FIG. 12. The erasing is performed for a cell well 12 unit. While the cell well 12 and the source line 23 are maintained at VCC, the word line 22 (gate 18) is applied with a high voltage of −13V, and the bit line 25 (drain 14) is floated. Therefore, a large potential difference occurs between the gate 18 and the cell well 12, rendering the trapped electrons in the charge trap layer 16 to be pulled out through the tunnel insulating layer toward the cell well 12 by FN tunneling effect.

Figure 13:
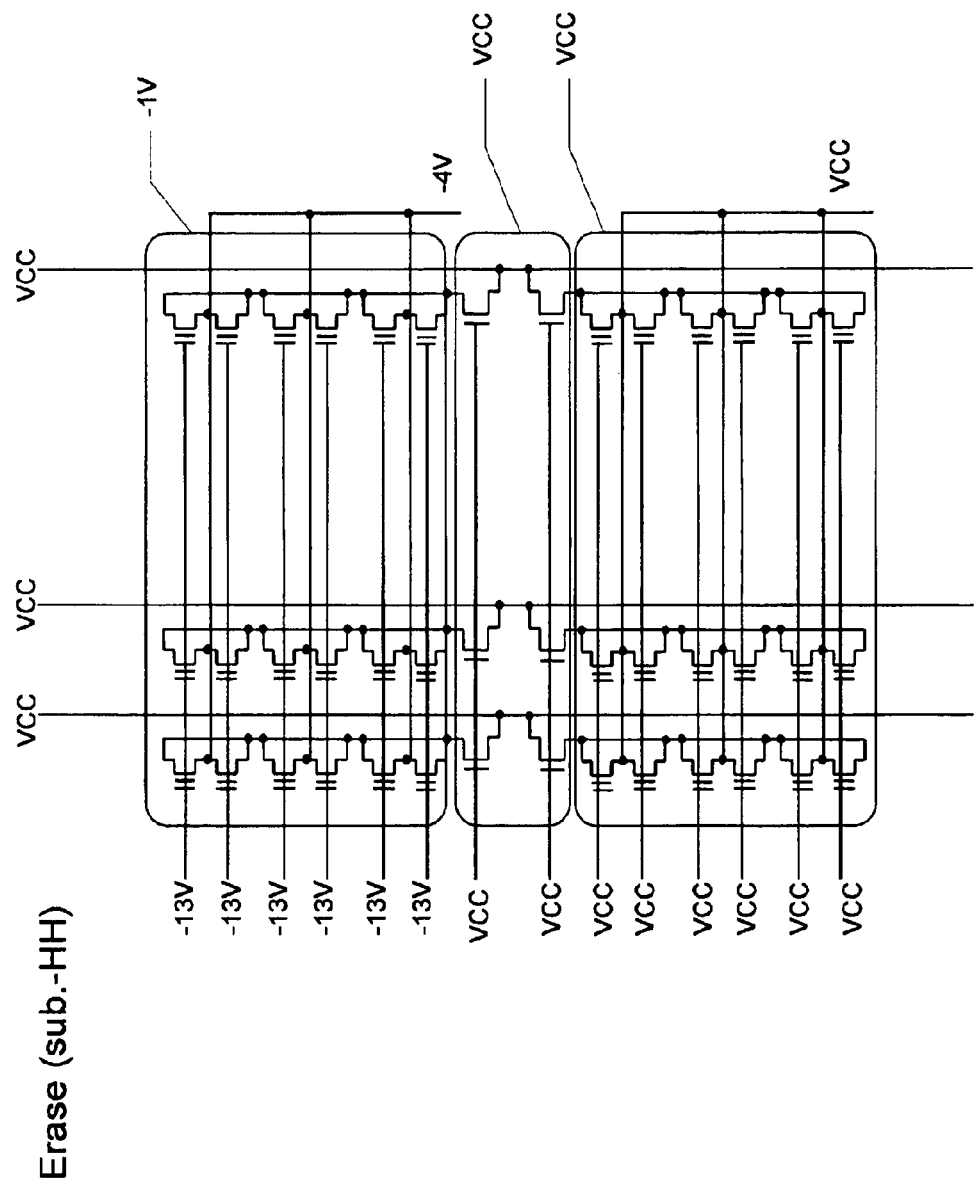
FIG. 13 shows a potential distribution in the equivalent circuit during erasing by substrate hot electron injection.
Figure 14:
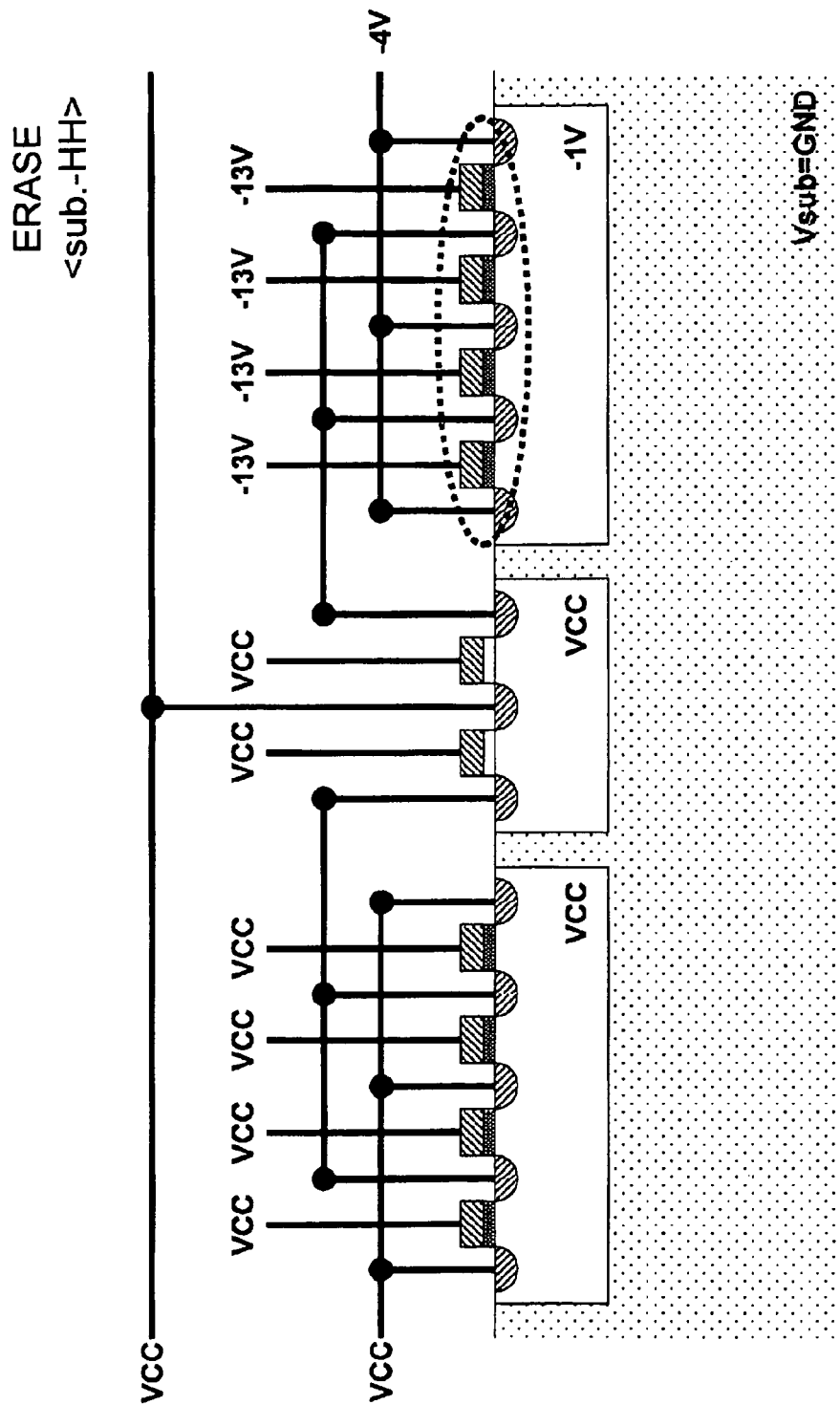
FIG. 14 shows a potential distribution in a cross sectional view during erasing by substrate hot electron injection.

Next, the method for erasing by using substrate hot hole injection is explained by referring to FIG. 3, FIG. 13 and FIG. 14. The cell well 12 is kept at −1V, the select gate is closed and the sub bit line 25 (drain 14) is opened. The word line 22 (gate 18) is applied with −13V and the source line 23 (source 13) is applied with −4V. Thus, by applying such voltages, the p type substrate 11, the n well 12 and the source 12 act as a pnp bipolar transistor, which makes the holes to be discharged to the source 13 from the p type semiconductor substrate 11. On the other hand, a part of the holes is pulled toward the gate electrode direction because the gate electrode 18 is applied with a negative high voltage. The holes move through the tunnel insulating layer 15 and penetrate into the charge trap layer 16. Negative charges of the electrons are canceled by positive charges of the holes, which erases the charges in the charge trap layer 16.

By the above potential distribution and operation the Y circuit can be configured by a fast circuit operating at GND-VCC.

As explained above, in this embodiment, the voltage between the drain and the source is reduced by applying an intermediate voltage the level of which is between the drain voltage and the source voltage to the source, the voltage across the source and the drain is reduced and equivalent Vth (absolute value) is increased by back gate effect which thereby renders a punch through to be suppressed, scaleability of gate length (scaled gate) to be improved greatly and gate length less than 0.1 μm may be realized with NOR type structure.

In this embodiment, the following two features are realized in order to achieve fast writing.

(1) By applying appropriate back gate voltage to the cell well 12, all operations are performed by applying 0V~VCC (1.8V) to the bit lines. Therefore, the Y circuit which plays a key role in fast writing can be configured only with high performance VCC transistors and no special circuit is necessary because no negative voltage is used.

(2) While a back gate voltage of approximately 4V is applied during reading, the verifying is also performed under this back gate voltage. Therefore, the switching from/to the programming to/from the verifying can be made quickly without using a large capacity power supply circuit.

Furthermore, a MONOS memory cell is better than a usual floating gate type flash memory (described in Japanese Patent Publication H09-8153, for example) in the following points.

The MONOS type is more robust against errors caused by defectives than a floating gate type. In the floating gate type, a defect which causes a very small leak in the tunnel insulating layer (a bottom oxide layer) may discharge all charges in the floating gate through this leak, rendering stored information to be lost. In a nonvolatile semiconductor memory device which requires decade long data retention, allowable leak level is considerably smaller than leak levels of other devices (for example, it requires $X10^{-8}$ small leak level compared with a DRAM). Therefore, realizing a process which does not cause any small defects becomes very difficult.

On the contrary, the MONOS type traps charges in a insulating layer of nitride layer. When there would be a small defect in upper or lower oxide layers, charges near to the defect may leak. However, not all charges flow out. Accordingly, the MONOS structure is more robust to defects than the floating gate type.

While the writing method to the memory cell of p channel MONOS structure is explained in this embodiment, the present invention can be applied to an n channel MONOS memory by inverting the polarity of the potential distribution and the like as shown in FIG. 3.

In this embodiment, the writing method to the memory cell with MONOS structure was shown in FIG. 1 and was explained; however the method may be applied to the floating gate type nonvolatile semiconductor memory, a nonvolatile semiconductor memory which holds the charges in a nano crystal layer, and the like.

The present invention may be applied not only to a NOR type memory cell array but also to a NAND type memory cell array.

The voltage values as shown in FIG. 7 and the like are examples and can be other values which meet the condition of the present invention. In these cases, an external supply voltage may be applied not only to the source and the drain but also to others.

Figure 15:
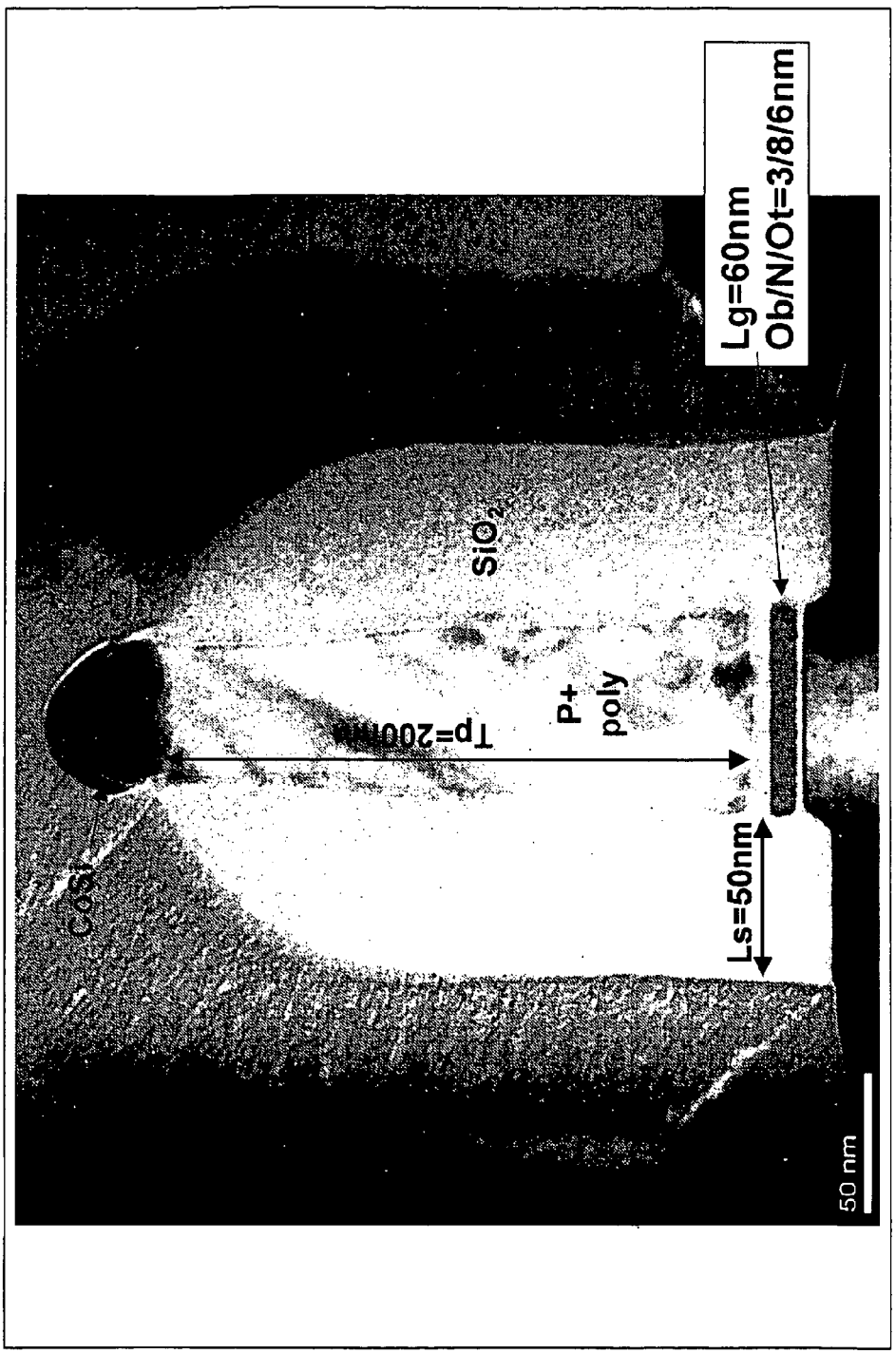
FIG. 15 shows a cross sectional transmission electron microscope photo of an experimental p-channel MONOS memory cell.
Figure 16:
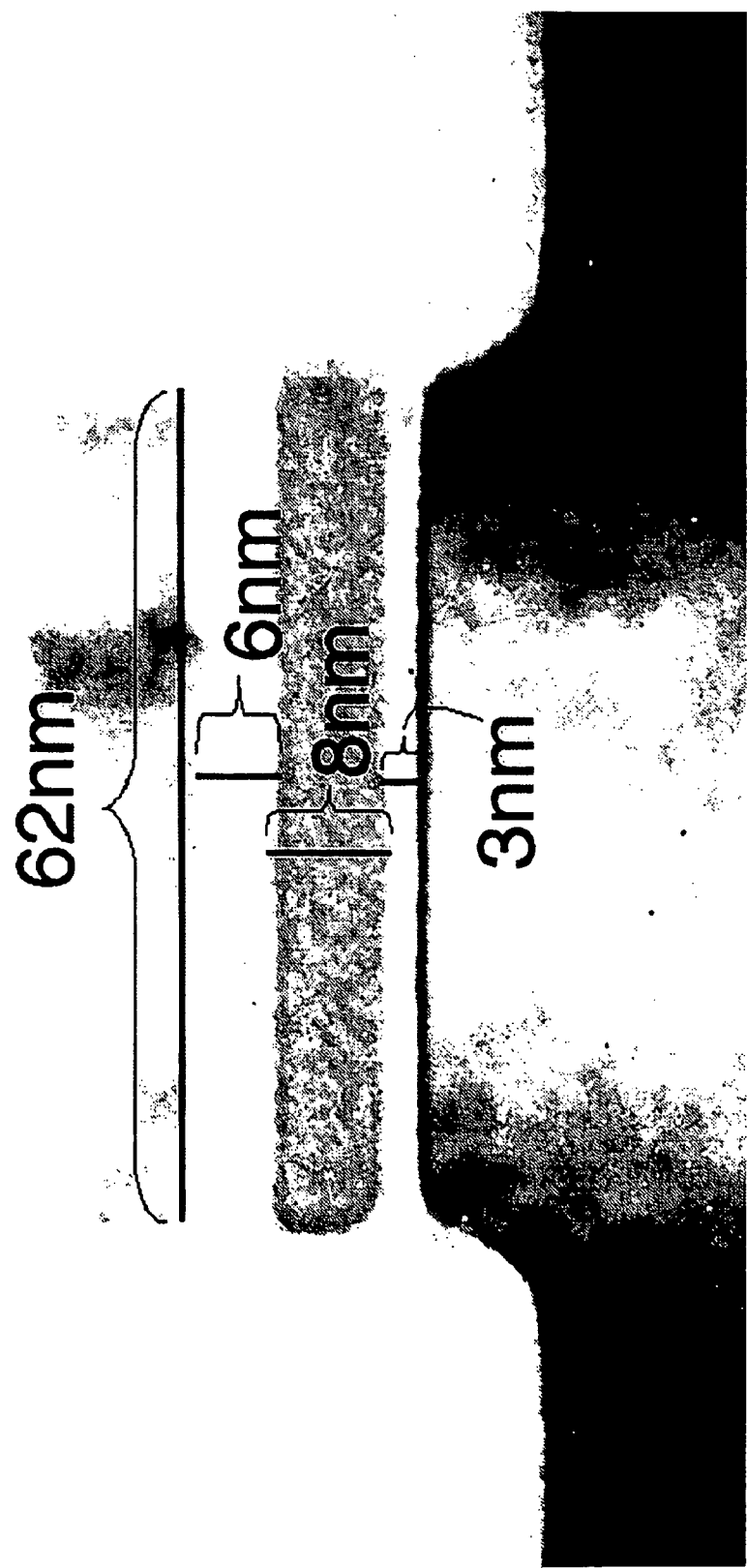
FIG. 16 shows an enlarged view of said transmission electron microscope photo.
Figure 17:
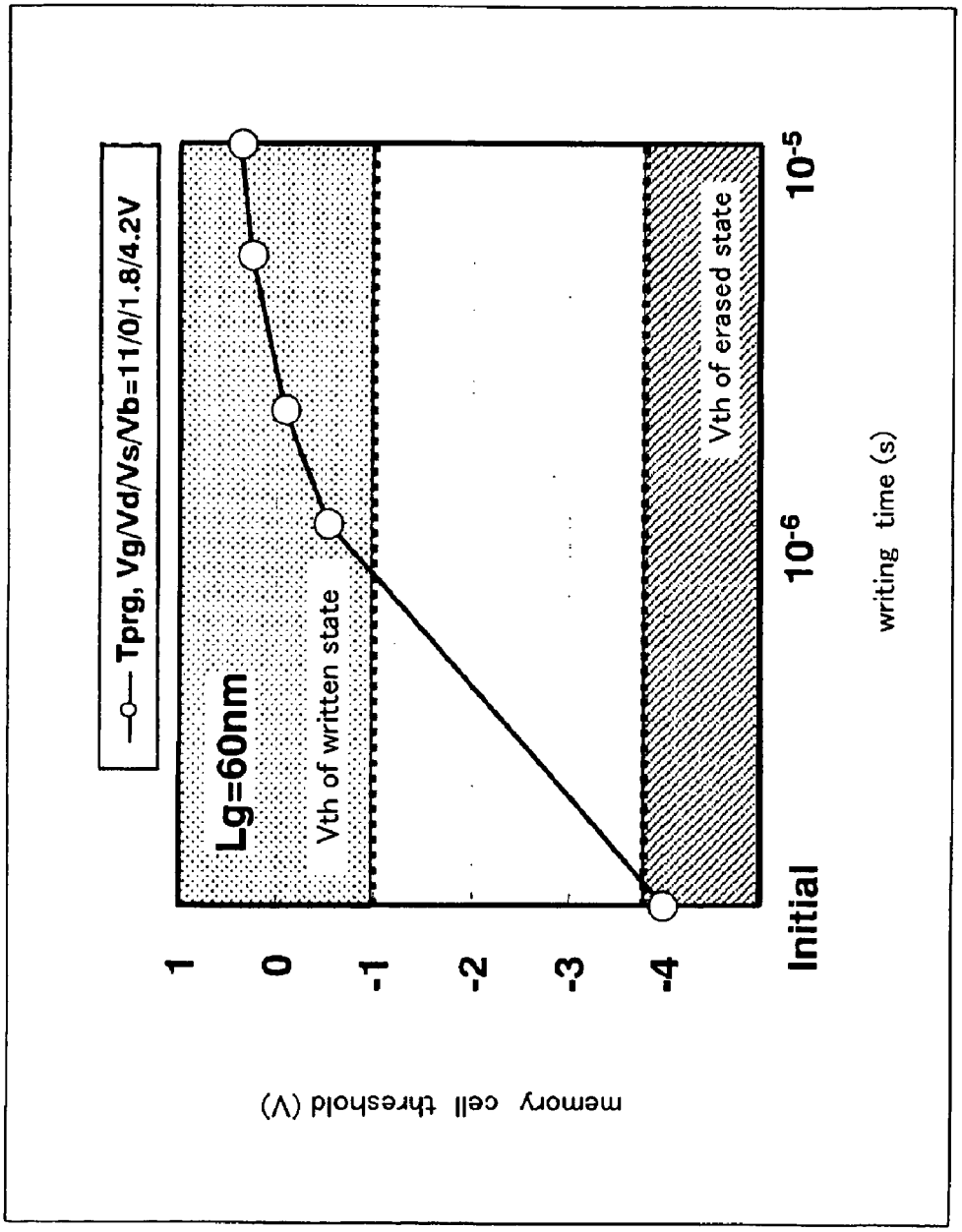
FIG. 17 shows a relationship between writing time and threshold voltage from experimental result on said p-channel MONOS memory cell.

The applicant made experimental p channel MONOS memory cells and evaluated their writing performances. FIG. 15 and FIG. 16 show a cross sectional transmission electron microscope (TEM) photo of the experimental memory cell. FIG. 16 shows an enlarged view near the ONO layer of the photo as shown in FIG. 15. In this memory cell, the thicknesses of the tunnel insulating layer, the charge trap layer and the insulating layer over the charge trap layer are 3 nm, 8 nm and 6 nm respectively, which approximately meet the scale explained in FIG. 1. The gate length is 62 nm. A poly-silicon gate electrode is made with a thickness of 200 nm in order to secure conductivity. In the memory cell having this structure, a writing test under the condition of the gate voltage $Vg=11V$, the cell well voltage (back gate voltage) $Vsub=4.2V$, the source voltage $Vs=1.8V$ and the drain voltage $Vd=0V$ exhibited the result shown in FIG. 17. According to this result, the writing finished in 1 μs, and shows that scaling of the gate length and higher writing speed are achieved at the same time.

Summary of the Nonvolatile Semiconductor Memory According to this Invention (1) As described above, the nonvolatile semiconductor memory according to the present invention is summarized as follows:

A nonvolatile semiconductor memory comprising, an n type well formed in a semiconductor substrate, a source and a drain of p+ regions formed in said n type well with a predetermined interval, a channel region located between said source and said drain, a first insulating layer formed on said channel region, a charge accumulation layer formed on said first insulating layer, and a second insulating layer formed on said charge accumulation layer, and a gate electrode formed on said second insulating layer, characterized in that: during programming, a bit line connected to said drain is applied with ground potential.

The nonvolatile semiconductor memory according to this invention is that during said programming, a source line connected to said source is applied with a power supply potential.

The nonvolatile semiconductor memory according to this invention is that said power supply potential is supplied from external to said nonvolatile semiconductor memory.

The nonvolatile semiconductor memory according to this invention is that during said programming, said n well is applied with a positive potential.

The nonvolatile semiconductor memory according to this invention is that during programming, a word line connected to said gate electrode is applied with a positive potential.

The nonvolatile semiconductor memory according to this invention is that during said programming, said n well is applied with a first positive potential and a word line connected to said gate electrode is applied with a second positive potential.

The nonvolatile semiconductor memory according to this invention is that during said programming, said source is applied with a third positive potential which is greater than said ground potential and less than said first and second positive potentials.

The nonvolatile semiconductor memory according to this invention is that said charge accumulation layer is a floating gate.

The nonvolatile semiconductor memory according to this invention is that said charge accumulation layer is a silicon nitride layer.

(2) As described above, the other aspect of the nonvolatile semiconductor memory according to the present invention is summarized as follows:

A nonvolatile semiconductor memory comprising an n type well and a PMOS cell transistor characterized in that during programming said n type well is applied with a first positive potential; a drain of said PMOS cell transistor is applied with a ground potential; and a gate and a source of said PMOS cell transistor are applied with second and third positive potentials.

The nonvolatile semiconductor memory according to the invention is that said ground potential and said third potential are supplied from external to said nonvolatile semiconductor memory.

The nonvolatile semiconductor memory according to the invention is that said first and said second potentials are greater than said third potential.

The nonvolatile semiconductor memory according to the invention is that said PMOS cell transistor has a floating gate.

The nonvolatile semiconductor memory according to the invention is that said PMOS cell transistor has a silicon nitride layer.

(3) As described above, still other aspect of the nonvolatile semiconductor memory according to the present invention is summarized as follows:

A nonvolatile semiconductor memory having PMOS cell transistor with a charge accumulation layer, the PMOS cell transistor being formed in an n type well, characterized in that: a programming is performed by using Band To Band Tunneling current to inject charges into said charge accumulation layer; and during programming, said n type well is positively biased to enhance said Band To Band Tunneling electron to be hot.

The nonvolatile semiconductor memory device according the invention is that during said programming, a drain of said PMOS cell transistor is applied substantially with ground voltage.

The nonvolatile semiconductor memory device according the invention is that during said programming, said n type well is biased with a first positive potential and a gate of said PMOS cell transistor is applied with a second positive potential.

Design of Nonvolatile Semiconductor Memory Utilizing the Above Described Method for Programming (Layout of Memory Cells)

Figure 18:
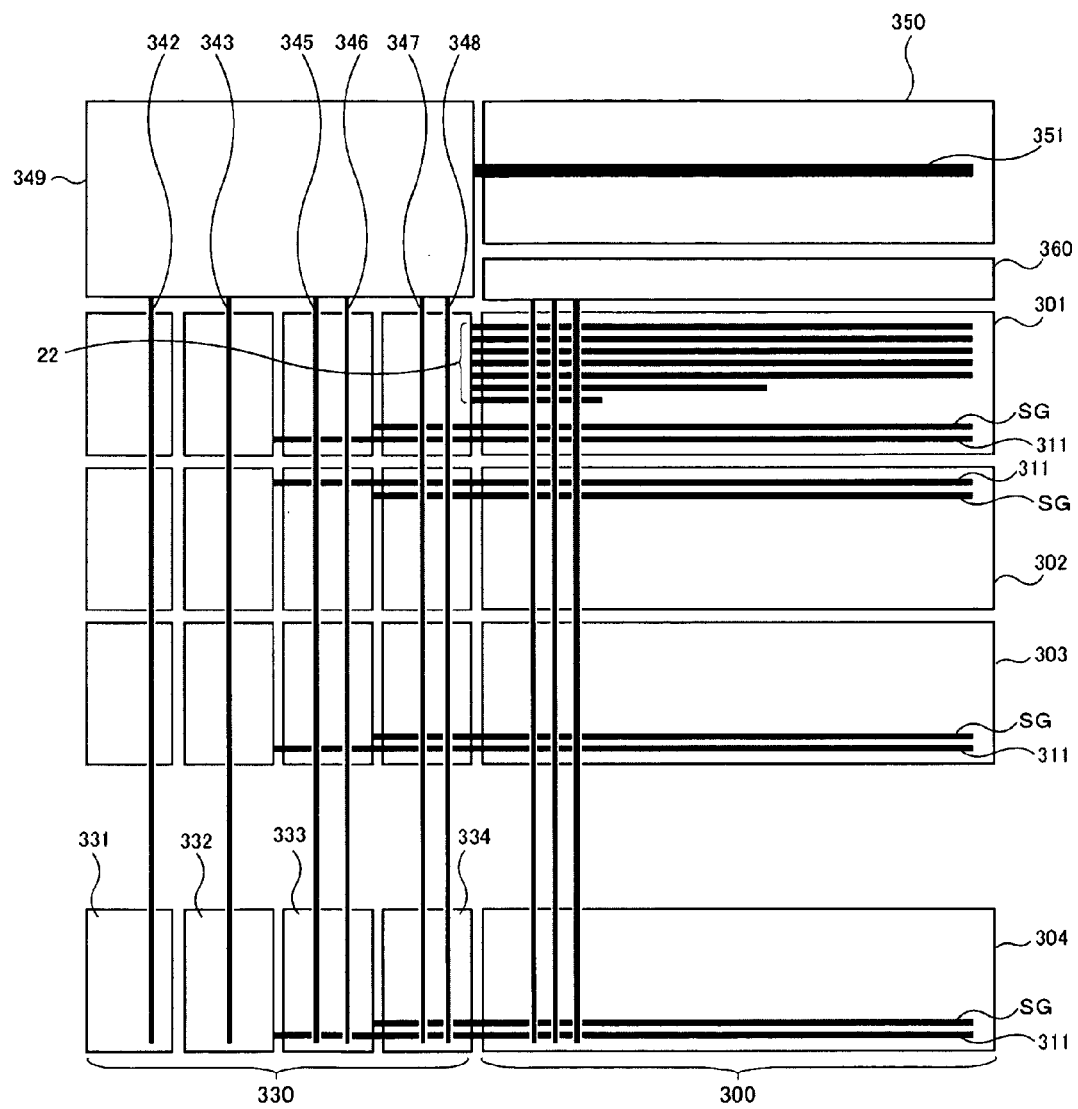
FIG. 18 shows an example of a layout of the nonvolatile semiconductor memory device of the present invention.

FIG. 18 shows a layout of the nonvolatile semiconductor memory device of the present invention. A memory cell array 300 is divided into a plurality of sub blocks 301, 302, 303, . . . 304. The memory cells arranged in the form of a matrix which belongs to the sub block 301, is formed in a common cell well 12 as shown in FIG. 2. The memory cells of a designated column in the sub block 301 are connected to a common sub bit line 25 (not showing in FIG. 18). The sub bit lines 25 are formed of a first metal wiring layer. The memory cells of a designated row in the sub block 301 are connected to a common word line 22. The word line 22 is formed of poly-silicon or a two-layered film of refractory metal and poly-silicon.

The sub blocks 302, 303, . . . 304 are similar to the sub block 301. Each of the select gates 24 corresponds to each of the sub blocks. The select gate 24 is driven by select gate line (SG). The select gate line (SG) is formed of a second metal wiring layer.

A cell well driving line 311 to charge and discharge the cell well is formed in each sub block in parallel with the word line 22 and the select gate line SG. The cell well driving line 311 is connected to the cell well 12 electrically at a plurality of point in the cell well 12. The cell well driving line 311 is connected to the cell well 12 electrically by a contact hole. A plurality of driving circuit units 330 are arranged in the column direction. Each driving circuit unit 330 is adjacent to each sub block.

Each driving circuit unit is composed of source line driving circuit 331, cell well driving circuit 332, select gate line driving circuit 333 and word line driving circuit 334.

(Word Line Driving Circuit)

The word line driving circuit 334 drives the word line (WL) 22 as shown in FIG. 3. The word line driving circuit 334 outputs 10V during programming, −8V during erasing and −2.2V during reading out to a selected cell. The word line driving circuit outputs VCC during programming, VCC during erasing and VCC during reading out to non-selected cells.

Figure 19:
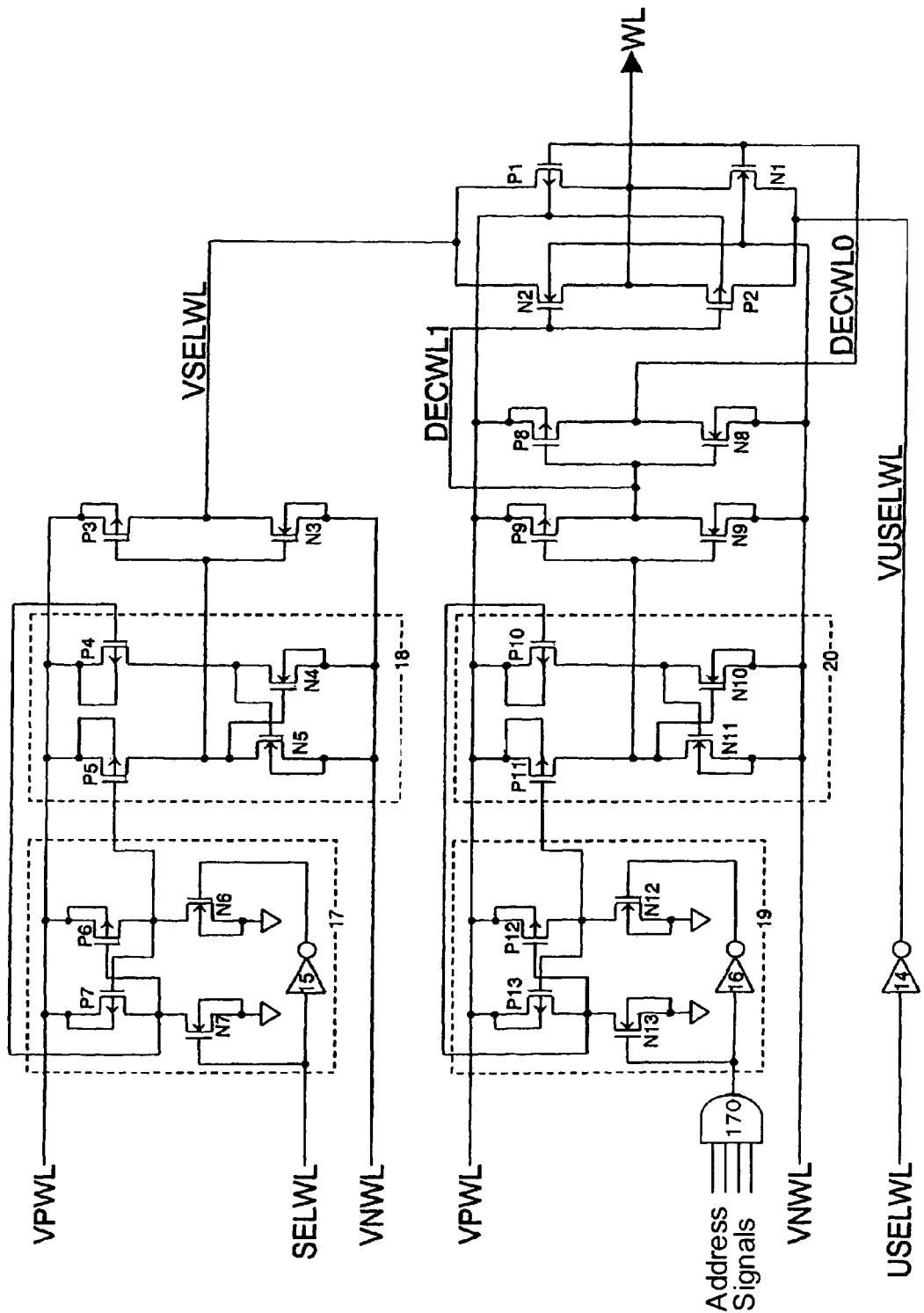
FIG. 19 shows an example of a detail circuitry of the word line driving circuit.

The detail circuitry of the word line driving circuit 334 is shown FIG. 19.

VPWL is a positive high voltage not less than VCC, it receives the voltage from a positive charge pump circuit via a distributor circuit which is after mentioned.

On the other hand, VNWL is a negative high voltage not more than GND, it receives the voltage from a negative charge pump circuit via a distributor circuit which is after mentioned. A level shift circuit 17 composed of transistors N6, N7, P6, P7 and an inverter 15 converts two value signals of input signal SELWL [VCC, GND] to [VPWL, GND].

A level shift circuit 18, which receives signals from the level shift circuit 17, composed of transistors N5, N4, P5 and P4 converts two value signals of input signal [VPWL, GND] to [VPWL, VNWL], and supplies the signal to node VSELWL.

A level shift circuit 19 composed of transistors N12, N13, P12, P13 and an inverter 16 receives two value signals [VCC, GND] of output of AND gate 170, which decodes WL selection address signals, and converts received signals to [VPWL, GND].

A level shift circuit 20, which receives signals from the level shift circuit 19, composed of transistors N10, N11, P10 and P11 converts two value signals of input signal [VPWL, GND] to [VPWL, VNWL], and supplies the signal to a inverter composed of transistors N9 and P9.

Output of the inverter composed of transistors N9 and P9 is set at DECWL1. DECWL1 is inputted to an inverter composed of transistors N8 and P8, the inverter concerned outputs DECWL0.

Address becomes a selected state, when the output of AND gate 170 is VCC, DECWL1 becomes VPWL and DECWL0 becomes VNWL. At this time, transistors N2 and P1 turn on, and transistor N1 and P2 turn off, therefore the voltage of VSELWL is transmitted to WL. This is a WL selected state.

As described above, when SELWL=VCC, VSELWL becomes VPWL and then the positive high voltage is applied to the WL which is in the selected state.

When SELWL=GND, VSELWL becomes VNWL and then the negative high voltage is applied to the WL which is in the selected state.

Hereby, the high voltages of positive and negative can be applied to selected WLs.

On the other hand, address becomes a non-selected state, when the output of AND gate 170 is GND, DECWL1 becomes VNWL and DECWL0 becomes VPWL. At this time, transistors N2 and P1 turn off, and transistors N1 and P2 turn on, therefore the voltage of VUSELWL is transmitted to WL. This is a WL non-selected state.

When USELWL is GND, VUSELWL is made VCC by an inverter 14, and non-selected WLs become VCC.

When USELWL is VCC, VUSELWL is made GND by the inverter 14, and non-selected WLs become GND.

According to the construction as above, the selected WL can be set to the high voltages of positive and negative, and the non-selected WLs can be set at VCC/GND.

The source line driving circuit 331 drives the source line 23.

High voltage supply wires 347 and 348 are formed in the column direction on the word line driving circuit 334 arranged in the column direction. The high voltage supply wire 347 supplies VPWL which is the positive high voltage and the voltage supply wire 348 supplies VNWL which is the negative high voltage. The high voltage supply wires 347 and 348 are formed in a third metal wiring layer.

(Select Gate Line Driving Circuit)

The select gate line driving circuit 333 drives the select gate line (SG) 24, as shown in FIG. 3. The select gate line driving circuit 333 outputs −2.2V during programming, VCC during erasing and −2.2V during reading out to selected select gates. It may be formed to supply 6V during erasing. The select gate line driving circuit 333 outputs VCC during programming, VCC during erasing and VCC during reading out non-selected select gates.

Figure 20:
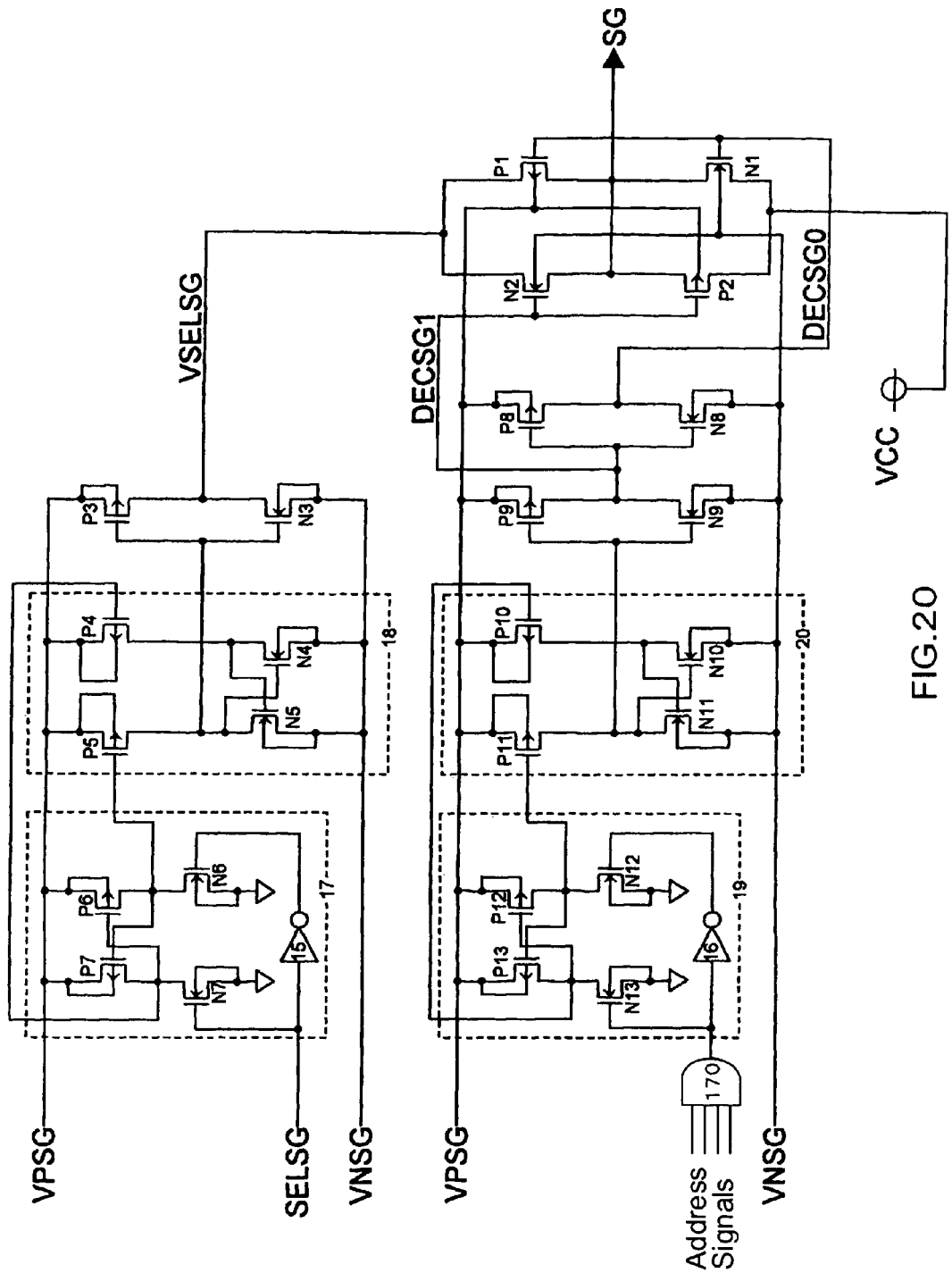
FIG. 20 shows an example of a construction of the select gate line driving circuit.

FIG. 20 shows a construction of the select gate line driving circuit. Symbols of elements correspond to each element of the word line driving circuit. Although the select gate line driving circuit is constructed no less than the word line driving circuit, a part of the select gate line driving circuit, which corresponds to VUSELWL signal in the word line driving circuit, is VCC. Because, in the SG, the level of the non-selected SG is always VCC in each operation condition.

According to such a construction, the selected SG can be set at the high voltages of positive and negative VPSG, and the non-selected SG can be set at VCC.

High voltage supply wires 345 and 346 are formed in the column direction on the select gate line driving circuit arranged in the column direction. The high voltage supply wire 345 supplies VPSG which is the positive high voltage, and the voltage supply wire 346 supplies VNSG which is the negative high voltage. The high voltage supply wires 345 and 346 are formed in the third metal wiring layer.

(Cell Well Driving Circuit)

The cell well driving circuit 332 drives the cell well 12 (Cell-well), as shown in FIG. 3. The cell well driving circuit 332 outputs 4V during programming, VCC or −1V during erasing and VCC during reading out to a selected cell well. The select gate line driving circuit 333 outputs VCC during programming, VCC during erasing and VCC during reading out to non-selected cells.

Figure 21:
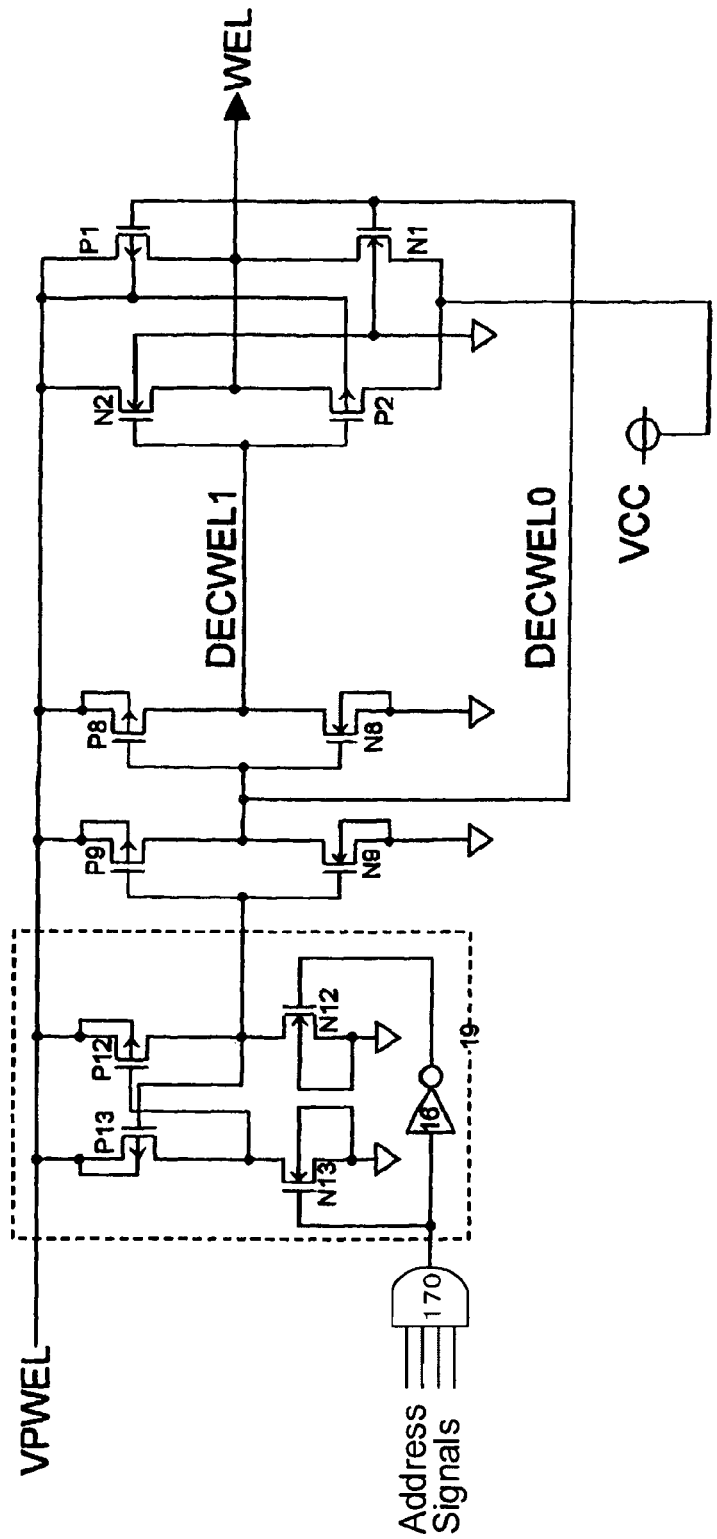
FIG. 21 shows an example of a construction of the cell well driving circuit.

FIG. 21 shows a construction of the cell well driving circuit 332. According to this construction, VPWEL level is supplied to the selected cell well and VCC is supplied to the non-selected cell wells.

High voltage supply wire 343 is formed in the column direction on the cell well driving circuit 332 arranged in the column direction. The high voltage supply wire 343 supplies VPWEL which is the positive high voltage. The high voltage supply wire 343 is formed in the third metal wiring layer.

(Source Line Driving Circuit)

The source line driving circuit 331 drives the source line 23 (Source), as shown in FIG. 3. The source line driving circuit 331 outputs VCC during programming, VCC during erasing and VCC during reading out to the selected source line 23. 6V maybe applied during erasing. The source line driving circuit 331 outputs VCC during programming, VCC during erasing and VCC during reading out to the source line 23.

Figure 22:
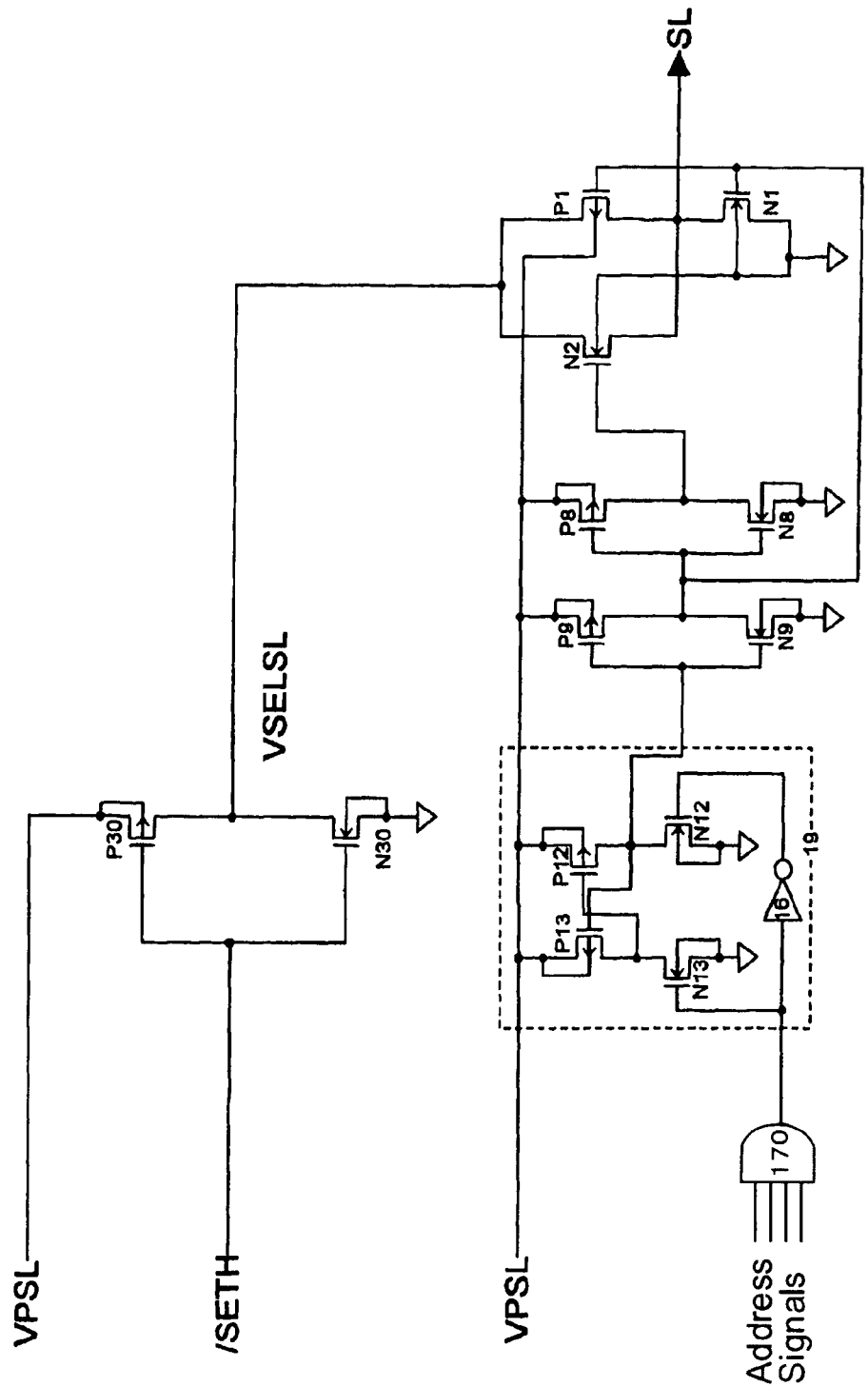
FIG. 22 shows an example of a construction of the source line driving circuit.

FIG. 22 shows a construction of the source line driving circuit 331.

VCC, GND and 6V during erasing are applied to the SL. 6V which is high voltage is supplied to VPSL. When SL is made in selected state by decode signals, transistors P1, N2 become on-state, and N1 becomes off-state, therefore, VSELSL is transmitted to the SL.

On the other hand, When SL is made in non-selected state, transistors P1, N2 become off-state, and N1 becomes on-state, thereby GND is transmitted to the SL.

By setting/SETH at 'HI', the selected SL becomes GND.

High voltage supply wire 342 is formed in the column direction on the cell well driving circuit 332 arranged in the column direction. The high voltage supply wire 342 supplies VPSL which is the positive high voltage. The high voltage supply wire 342 is formed in the third metal wiring layer.

(High Voltage Switch)

High voltage switch 349 is formed at one end of a plurality of driving circuit 330 arranged in the column direction. A high voltage charge pump circuit (voltage stepping up circuit) which generates positive and negative high voltage from VCC and GND may be included in this high voltage switch.

Figure 23:
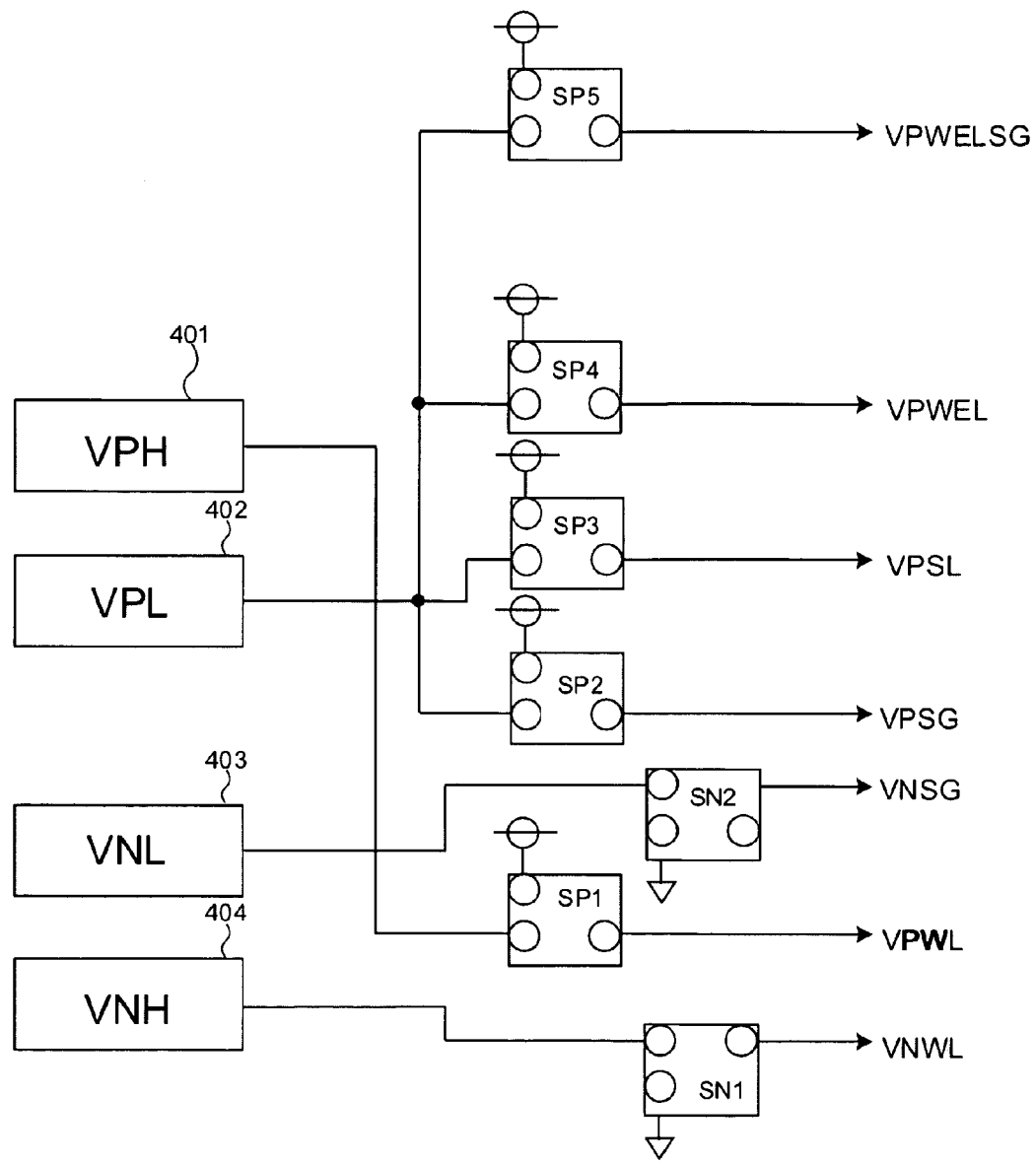
FIG. 23 shows an example of a construction of a high voltage switch.

FIG. 23 shows a construction of the high voltage switch 349.

VPH is a first positive charge pump circuit, VPL is a second positive charge pump circuit, VNH is a first negative charge pump circuit and VNL is a second negative charge pump.

The charge pump generates a desired voltage level by sensing its own output voltage level and feeds back the output voltage to itself.

The output of the charge pump VPH is connected to VPWL through a positive switching circuit SP1.

The positive switching circuit SP1 has a mode which connects the output of VPH and VPWL electrically in response to a control signal (not shown), and another mode which connects power supply VCC and VPWL electrically in response to the control signal.

Figure 24:
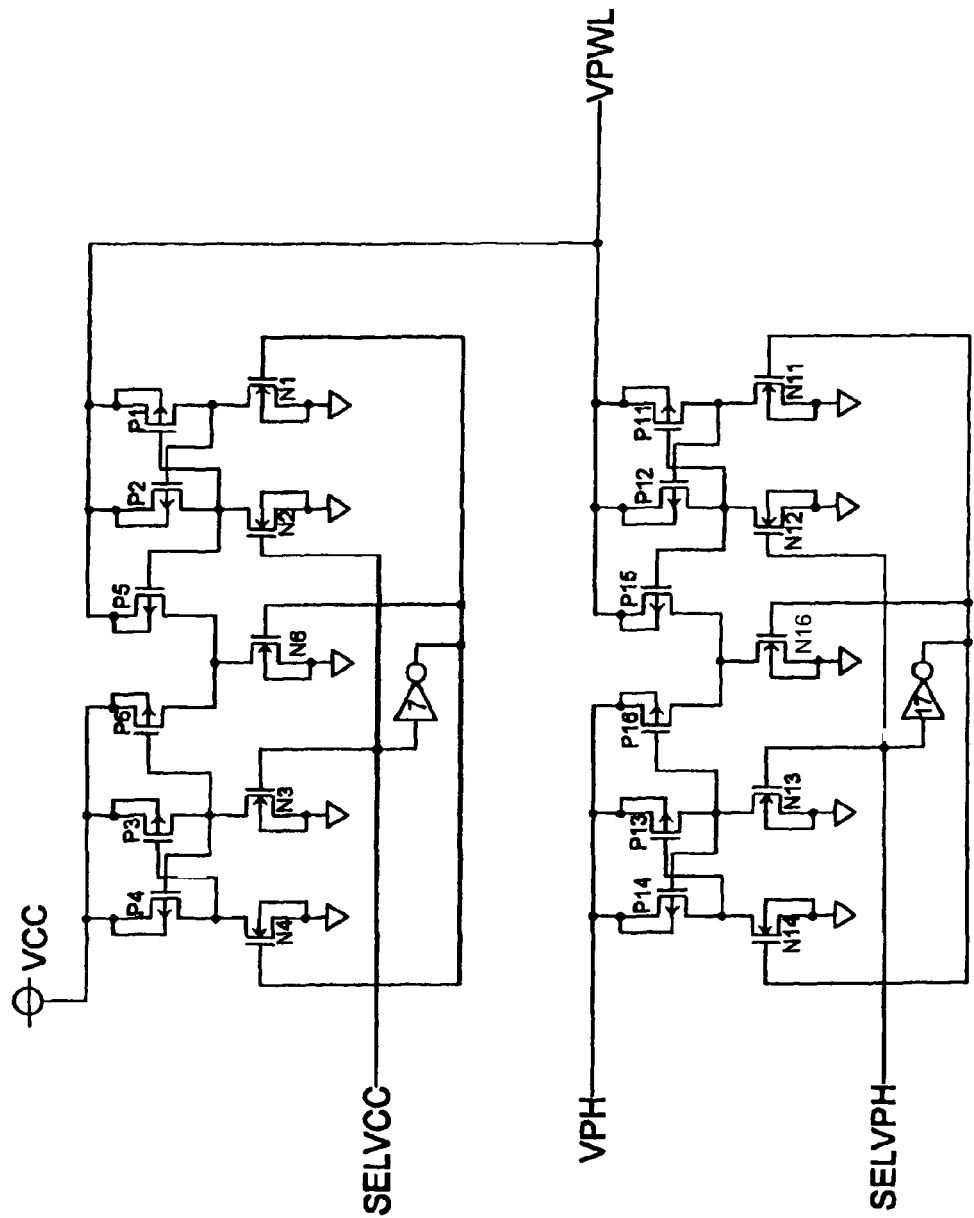
FIG. 24 shows a high voltage switch.

To put it concretely, this is realized in the circuit as shown in FIG. 24.

Here, SELVPH is set to 'H' when the output of VPH and VPWL are connected electrically. At this time, the transistor P16 becomes on-state by the level shift circuit composed of transistors N13, N14, P13 and P14, and the transistor P15 becomes on-state by the level shift circuit composed of transistors N11, N12, P11 and P12.

On the other hand, the transistor N16 is off-state. Therefore, VPH and VPWL are connected electrically.

SELVCC is set to 'H' when VCC and VPWL are connected electrically. At this time, the transistor P6 becomes on-state by the level shift circuit composed of N3, N4, P3 and P4, and the transistor P5 becomes on-state by the level shift circuit composed of N1, N2, P1 and P2.

On the other hand, the transistor N6 is off-state. Therefore, VCC and VPWL are connected electrically.

The output of the charge pump VNH is connected to VNWL through a negative switch circuit SN1.

The negative switching circuit SN1 has a mode which connects the output of VNH and VNWL electrically in response to a control signal (not shown), and another mode which connects a power supply GND and VNWL electrically in response to the control signal.

Figure 25:
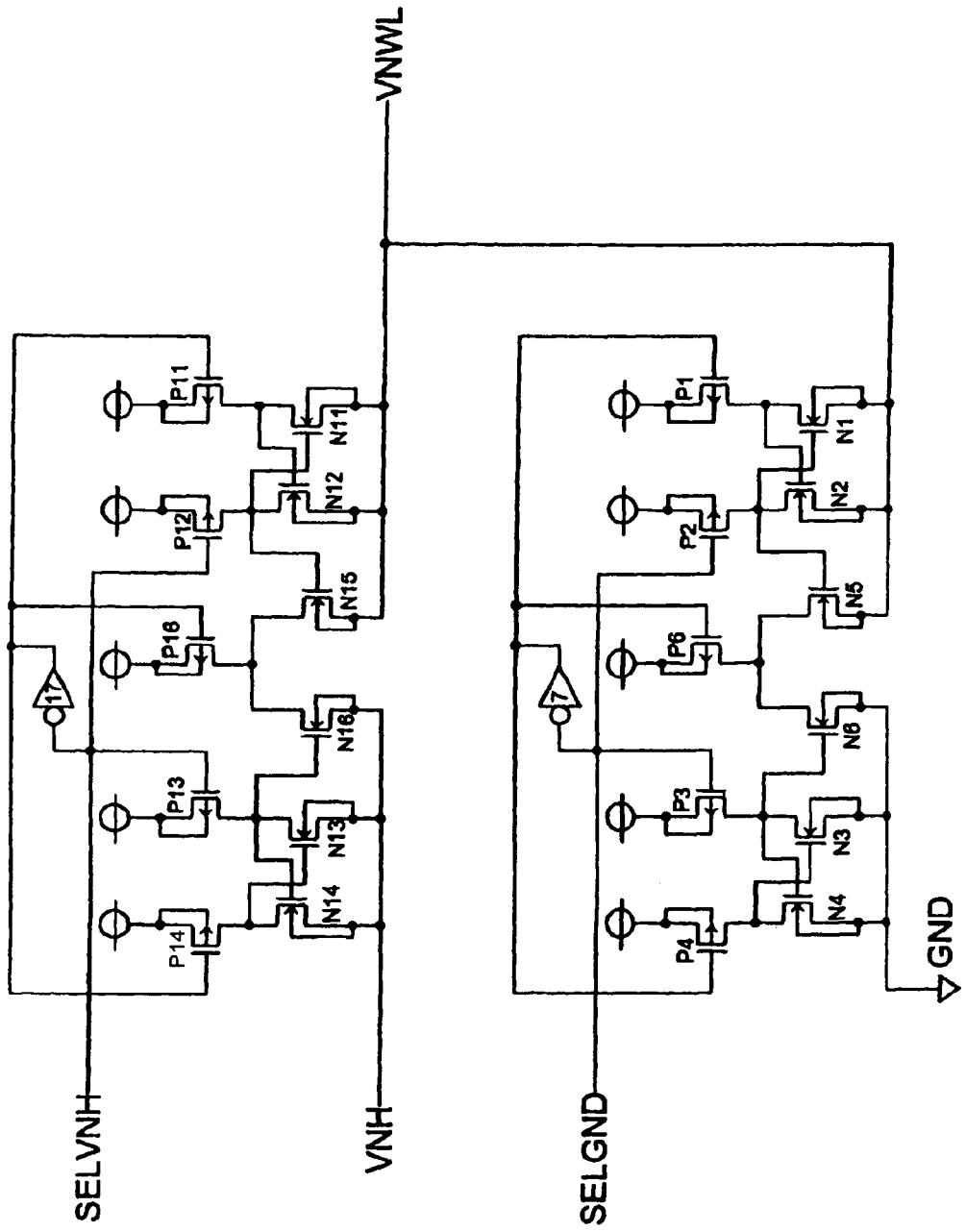
FIG. 25 shows a high voltage switch.

The actual circuit can be realized by the construction as shown FIG. 25.

SELVNH is set to 'L' when the output of VNH and VNWL are connected electrically. At this time, the transistor N16 becomes on-state by the level shift circuit composed of transistors N13, N14, P13 and P14, and the transistor N15 becomes on-state by the level shift circuit composed of transistors N11, N12, P11 and P12.

On the other hand, the transistor P16 is off-state. Hereby, VNH and VNWL are connected electrically.

SELGND is set to 'L' when GND and VNWL are connected electrically. At this time, the transistor N6 becomes on-state by the level shift circuit composed of transistors N3, N4, P3 and P4, and the transistor N5 becomes on-state by the level shift circuit composed of transistors N1, N2, P1 and P2.

Hereby, GND and VNWL are connected electrically.

According to the above construction, either VPH or VCC is transmitted to VPWL, and either VNH or GND is transmitted to VNWL respectively.

Select gate driving circuit receives VPSG as positive high voltage not less than VCC and VNSG as negative high voltage not more than GND respectively from the high voltage switching circuit.

The output of the charge pump VPL is connected to VPSG through a positive switching circuit SP2. The output of the charge pump VNL is connected to VNSG through a negative switching circuit SN2.

According to such a construction, either VPL or VCC is transmitted to VPSG, and either VNL or GND is transmitted to VNSG respectively.

Furthermore, the output of the charge pump VPL is connected to VPSL, VPWEL and VPWELSG respectively through the positive switching circuits SP3, SP4 and SP5.

(Column Circuit)

A column latch circuit 350 and a column decode circuit 360 are arranged at one end of the memory cell block 301 arranged in a line as shown in FIG. 18.

The column decode circuit 360 is optional, therefore, the constructions without it are possible.

The column circuit is composed of Vcc transistors (it is not a high voltage transistor but a high speed transistor) all as described above.

As described above, a relatively large current is flown to GND from the memory cell during programming. Then, GLP line (GND line for programming) 351 arranged in the column latch circuit 350 is required to be formed to have a small resistance compared with the bit line MBL.

Then, according to the evaluation by the inventors and so forth, it is proved that it is preferable to satisfy the following condition:

$r_{lw} = W_{GLP}/W_{MBL}$; line width ratio of GLP line compared with the bit line MBL $$2.52 r_R < r_{lw} < 895 r_R.$$

But, a ratio of a sheet resistance is set $r_R$ ($r_{GLP}/r_{MBL}$). A number of memory cells arranged in the column direction is not less than 128 and not more than 262,144.

The bit line MBL and the GLP line are preferably different metal wiring layers respectively.

It is preferable still, that the bit line MBL is the third metal wiring layer and GLP line is the second metal wiring layer.

(Column Latch Circuit)

Figure 26:
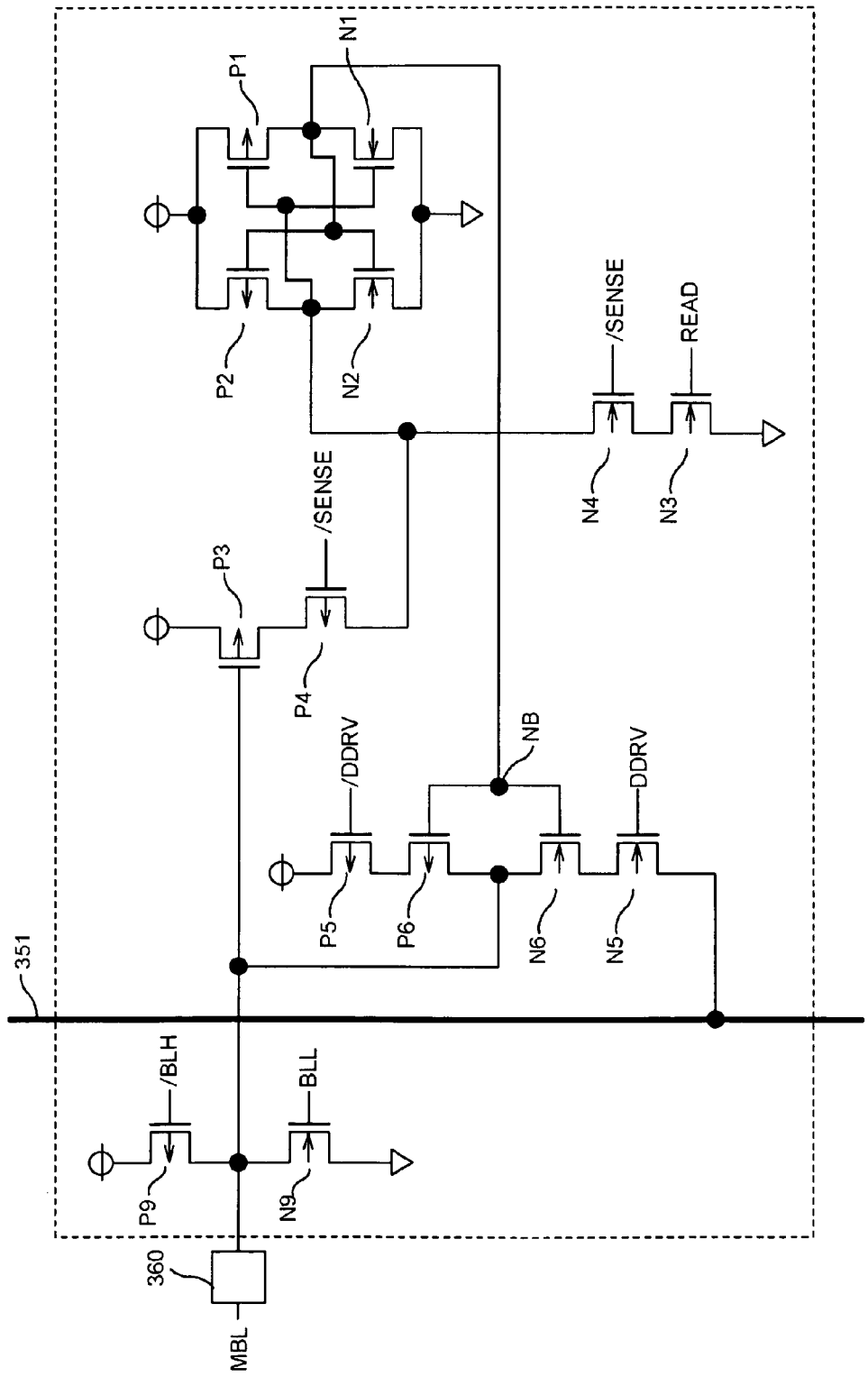
FIG. 26 shows a column latch circuit.

FIG. 26 shows the circuitry of the column latch circuit 350.

The transistors P9 and N9 charge or discharge the main bit line MLB to 'H' or 'L' respectively.

A flip flop circuit composed of transistors P1, N1, P2 and N2 stores the programming data. In case programs are performed, the data which makes a node NB 'H' is stored.

During programming, /DDRV becomes 'L' and DDRV becomes 'H'. Hereby, the transistors P5 and N5 are conductive. The main bit line MBL becomes 'L' when the node NB is 'H', Accordingly, the program is performed. The main bit line MBL becomes 'H' when the node NB is 'L'. Accordingly, the program is prohibited.

During reading out, /SENSE becomes 'L', and the transistor P4 is conductive. Therefore, the data, which is stored in the flip flop circuit, is decided in response to the read out data.

The following points are important in the circuit design.

It is required that the channel widths of the transistors N5 and N6 are larger than the channel widths of the transistors N2 and N1 which compose the flip flop circuit.

Then, according to the evaluation by the inventors and so forth, it is proved that it is preferable to satisfy the following condition.

$r_{cw} = cw_{N6}/cw_{N1}$; channel width ratio of N6 compared with N1

$1.25 < r_{cw} < 197$

A number of memory cells arranged in the column direction is not less than 128 and not more than 262,144.

All n type transistors in FIG. 26 are Vcc transistors, and their gate oxide layer thicknesses are substantially the same. As described above, the select gate transistors use the high voltage transistors. Accordingly, the gate oxide layer thickness of the select gate transistor is larger than n type transistor's in FIG. 26, particularly the gate oxide layer thicknesses of the MONOS transistors N1, N2, N5 and N6.

(Decoder)

Figure 27:
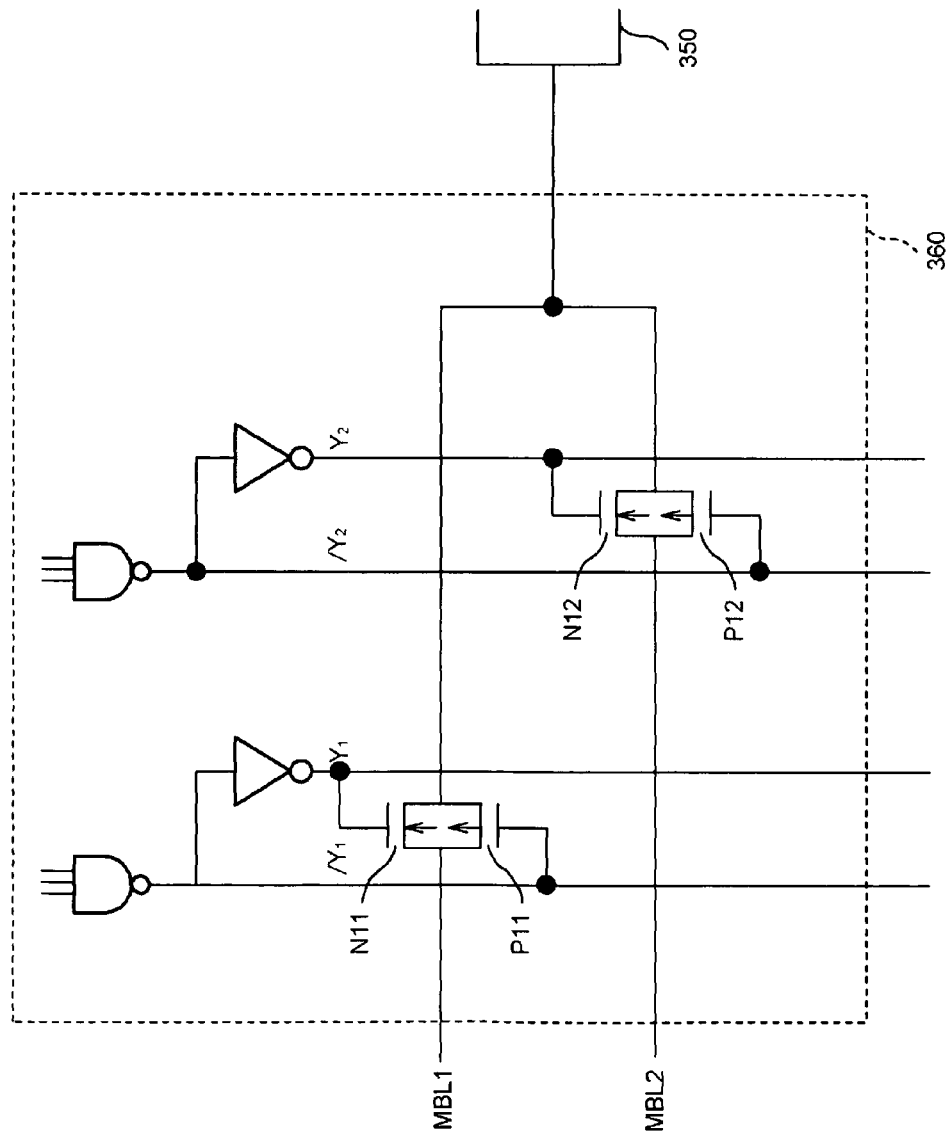
FIG. 27 shows a column decode circuit.

FIG. 27 shows the circuitry of the column decode circuit.

The transistors N11 and P11 are conductive in response to column selection signals Y1 and /Y1 respectively. When the transistors N11 and P11 are conductive, the column latch circuit and the bit line MBL1 are connected.

The transistors N12 and P12 are conductive in response to the column selection signals Y2 and /Y2 respectively. When the transistors N12 and P12 are conductive, the column latch circuit and the bit line MBL2 are connected.

The column selection signal is generated by a column selection generating circuit composed of NAND gates and inverters. Column address is inputted in the column selection generating circuit.

The column decode circuit has what is called a full CMOS construction as shown in FIG. 27. By this construction, both potentials VCC and GND are supplied to the memory cells certainly during programming.

All the MOS transistors shown in FIG. 27 are not the high voltage transistors but the Vcc transistors.

Every column selection signal line is formed by the same metal wiring layer. The column selection signal lines are formed by a wiring layer, the level of which is different from bit line. The column selection signal lines are preferably formed by copper.

The following points are important in the circuit design.

It is required that the channel widths of the transistors N11 and N12 shown in FIG. 27 are larger than the channel widths of the transistors N2 and N1 shown in FIG. 26, which compose the flip flop circuit.

Then, according to the evaluation by the inventors and so forth, it is proved that it is preferable to satisfy the following condition.

$r_{cw} = cw_{N11}/cw_{N1}$; channel width ratio of N11 compared with N1

$1.25 < r_{cw} < 197$

A number of memory cells arranged in the column direction is not less than 128 and not more than 262,144.

(Operation of Column Latch 1 Preprogramming)

The operation of the column latch circuit 350 of the present invention is explained additionally below.

Figure 28:
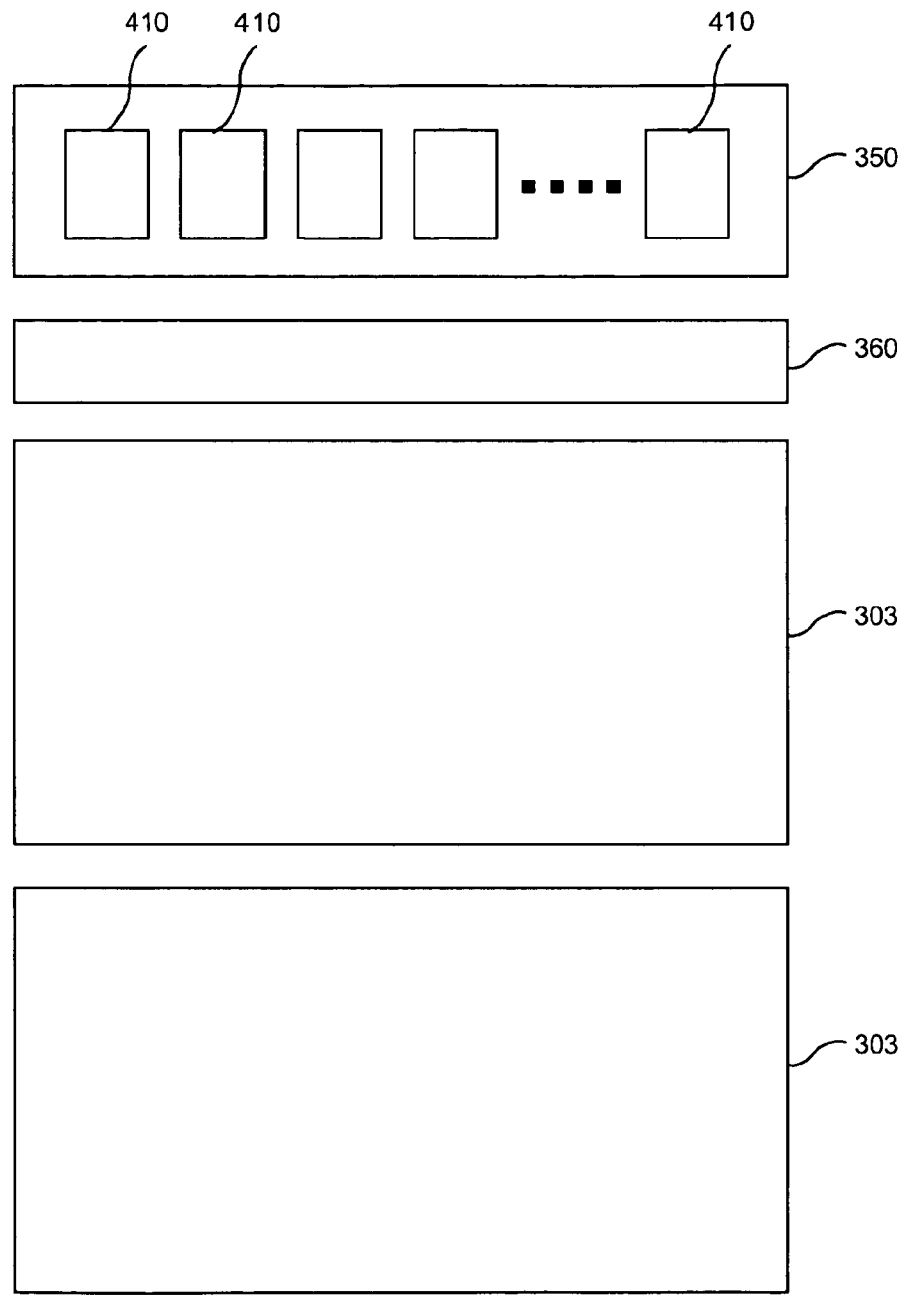
FIG. 28 shows a nonvolatile semiconductor memory.

As described above, a plurality of flip flop circuits 410 are arranged in the column latch circuit 350 (FIG. 28). Therefore, simultaneous programming to a plurality of memory cells is possible.

Figure 29:
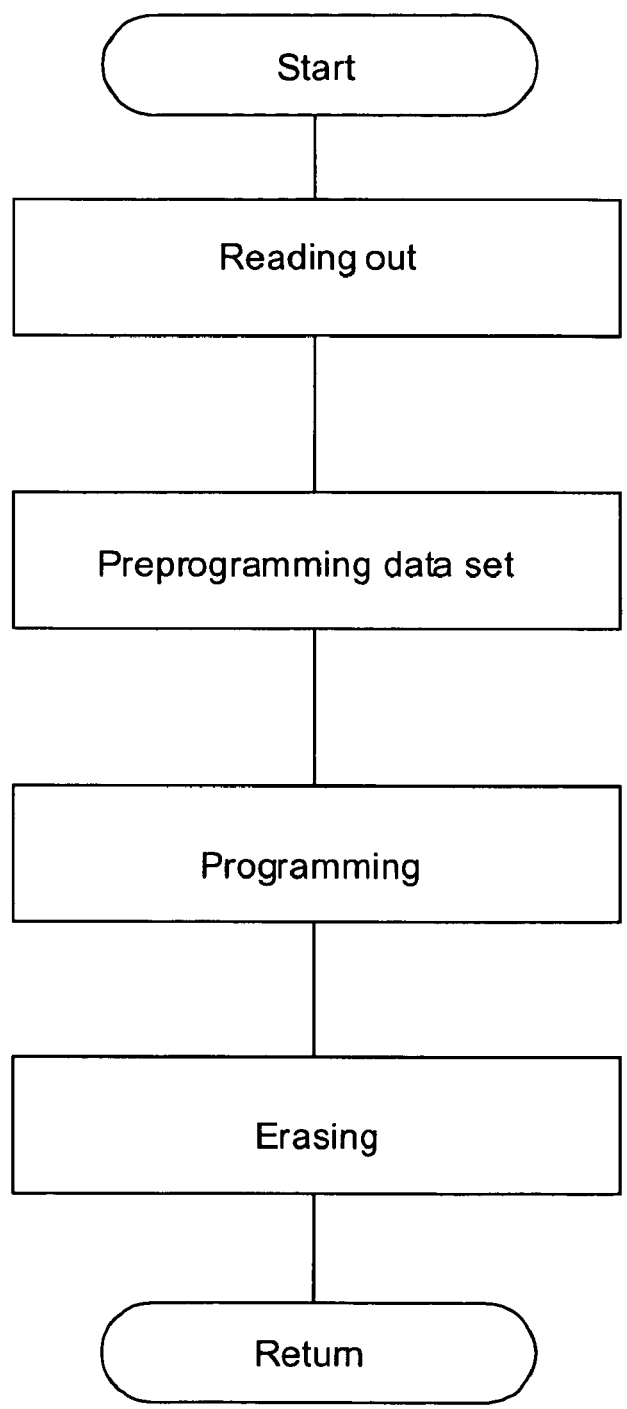
FIG. 29 shows a flow chart illustrating an operation of the nonvolatile semiconductor memory device.

Erasing is performed simultaneously in all the memory cells (the memory cell block 303) in the same cell well. In this case, the data are pre-programmed in order to prevent the not-programmed memory cells to be over-erased too. Then, all the data of the memory cells in the same cell well are erased (FIG. 29).

(Operation of Column Latch 2 Bit Line Reset)

The p type MOS transistor P9 to reset bit line MBL at 'H' is arranged in the column latch circuit 350 as shown in FIG. 26.

When programming command is input, /BLH becomes 'L' during stand-by, and the transistor P9 is conductive in the memory of the nonvolatile semiconductor memory device of the present embodiment. Therefore, the bit line MBL is reset at 'H'.

After the programming command is inputted, when programming is performed, /BLH becomes 'HI' and the transistor P9 becomes non-conductive.

Furthermore, the column latch circuit 350 is initialized in response to power-on-reset signal (it is a pulse signal which is generated when a power supply is injected), and all inner flip flop circuits 410 are reset in order to prevent erroneous operations.

The power-on-reset signal may be supplied from outside of the chip.

(Various Modifications)

The various modifications of the nonvolatile semiconductor memory of the present invention are explained thereinafter.

The memory cell array of the nonvolatile semiconductor memory of the present invention is NOR type.

When this construction is applied, it is preferable that data width during programming (a number of the data which can be programmed simultaneously) is different from the data width during reading out (a number of the data which can be read out simultaneously). The data width during reading out is made smaller than the data width during programming, and the data can be read out rapidly in random access.

Figure 30:
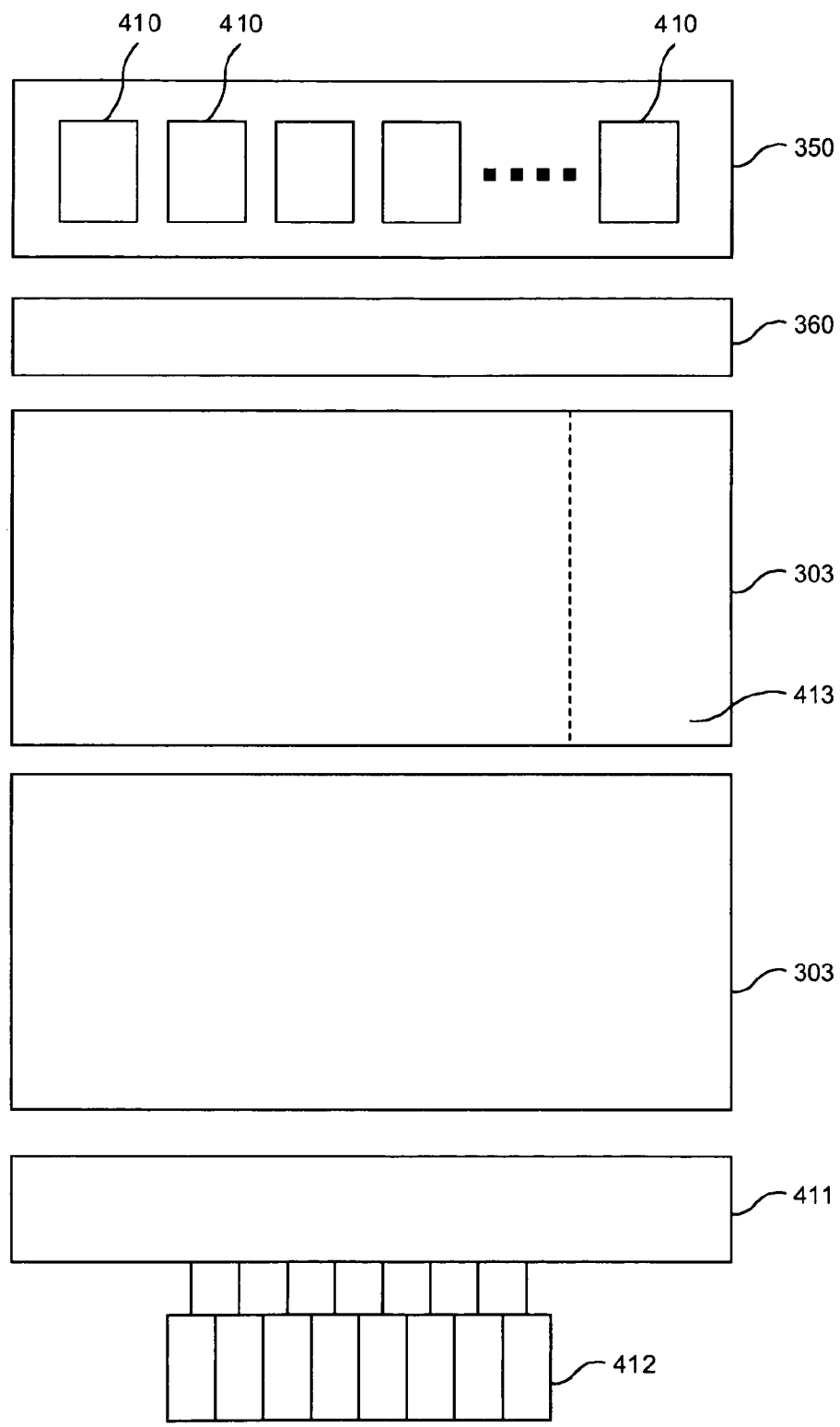
FIG. 30 shows an example of a nonvolatile semiconductor memory having narrower reading out data width than programming data width.

FIG. 30 shows the nonvolatile semiconductor memory having narrower reading out data width than programming data width. A column decoder for reading out 411 is arranged therein. When the column number of the memory cell block 303 are 2K+64 byte (64 byte are spares which will be explained hereinafter), a number of the flip flop circuits 410 is 16,896.

A sense amplifier circuit 412 used in reading out is arranged separately in order to enable fast operation. In the sense amplifier 412, 8 voltage comparison circuits are arranged. They compare the voltage of the bit line and reference voltage, and output reading out data respectively. The voltage comparison circuits are all composed of Vcc transistors. Accordingly, the transistors which compose the flip flop circuit 410 and the gate oxide layer thickness are substantially the same, and also back gate bias voltage is substantially the same.

A redundancy area 413 is formed in a part of the memory cell array. A logical-physical transformation table, spare cell which displace error cells and the like are arranged in this area.

Furthermore, multi-bit data can be stored in the nonvolatile semiconductor memory of the present invention.

Figure 31:
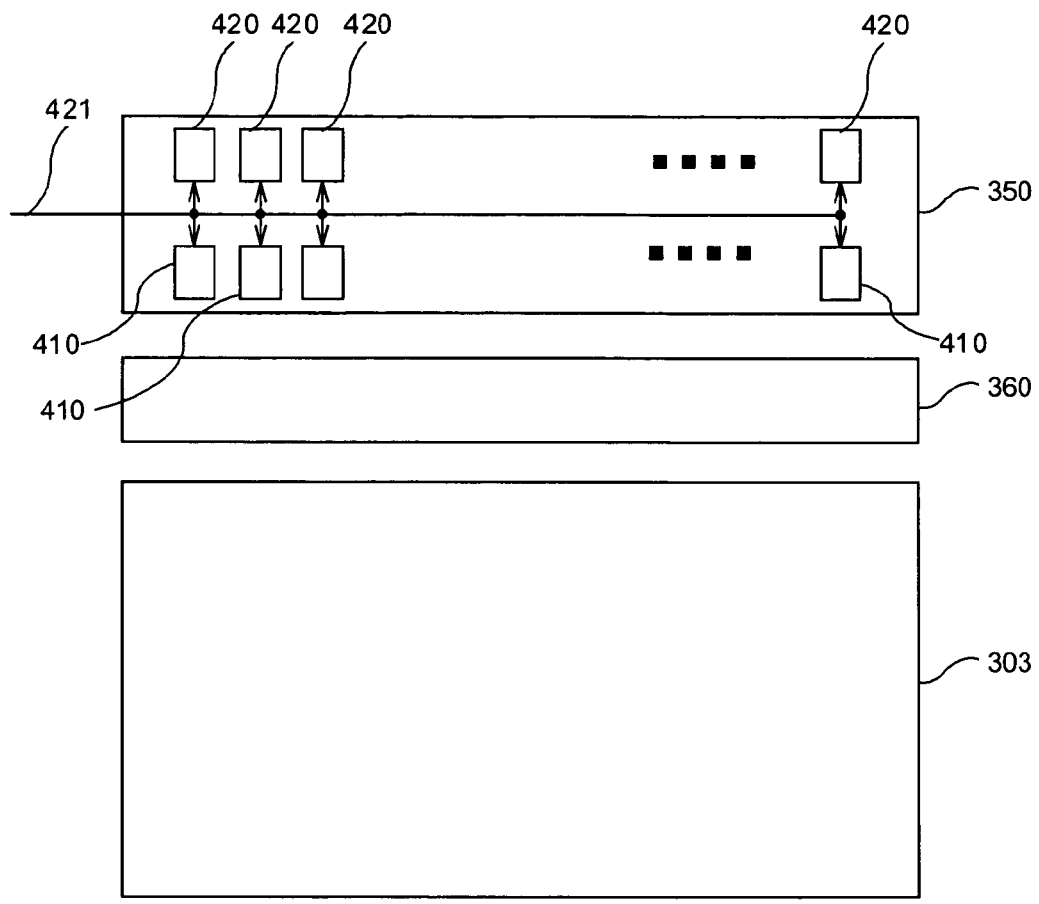
FIG. 31 shows an example of a nonvolatile semiconductor memory to store multi-bit data.

For example, in order to store 2 bit data in a memory cell, 2 flip flop circuits 410 and 420 are needed, because the 2 bit data are latched to one memory cell. In this reset operation described above, a single reset signal line 421 is preferably shared by two paired latches (FIG. 31).

Figure 32:
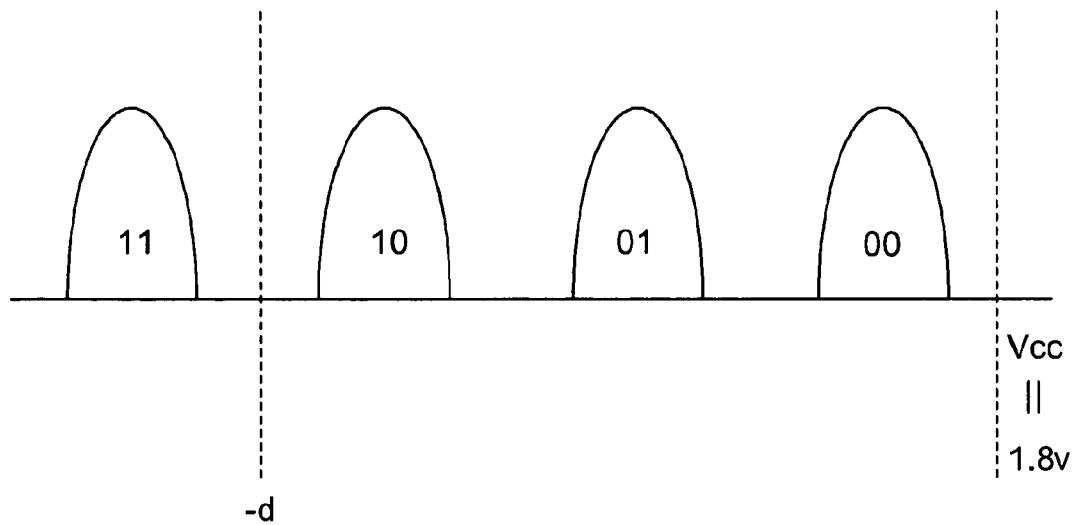
FIG. 32 shows an example of a distribution map of threshold voltages.

FIG. 32 shows a distribution map of the threshold of the memory cell, when the programming method of the present invention is applied. The threshold in erasing (it corresponds to data 11) is distributed lower than −dV, and the threshold in programming is distributed between VCC (=1.8V) and −dV which is less than 0V.

Then, according to the evaluation by the inventors and so forth, it is proved that it is preferable to satisfy the following condition $$3.73 < (VCC+d) < 6.22$$

Summary of Detailed Design Feature of the Nonvolatile Semiconductor Memory According to this Invention As described above, detailed feature of the nonvolatile semiconductor memory according to the present invention is summarized as follows:

(Cell Well Driving Line)

A nonvolatile semiconductor memory comprising:
a semiconductor substrate having a p type region;
a plurality of n type cell wells formed in said semiconductor substrate, said n type cell wells being isolated each others and arranged in a column direction;
a plurality of nonvolatile memory cells arranged in matrix and formed in said plurality of n type cell wells, each of said nonvolatile memory cells having a memory cell transistor of PMOS transistor with charge accumulation layer;
a plurality of word lines arranged in parallel along with a row direction which is perpendicular to said column direction, to control said plurality of nonvolatile memory cells in a same row;
a plurality of cell well driving lines arranged in parallel along with said row direction, each of said cell well driving lines corresponding to respective one of said cell wells;
a plurality of cell well driving circuits arranged in said column direction, said plurality of cell well driving circuits corresponding to respective one of said cell well driving lines with a cell well voltage; and
a voltage conversion circuit for receiving Vcc and for stepping-up the Vcc to generate said cell well voltage.

The nonvolatile semiconductor memory of this invention is that each of said cell well driving lines are electrically connected to corresponding one of said cell wells.

The nonvolatile semiconductor memory of this invention is that said cell well driving lines are formed by metal wirings.

The nonvolatile semiconductor memory of this invention is that said cell well driving lines are formed by copper wirings.

(Driving Circuit Unit)

A nonvolatile semiconductor memory comprising:
a semiconductor substrate having a p type region;
a plurality of n type cell wells formed in said semiconductor substrate, said n type cell wells being isolated each others and arranged in a column direction;
a plurality of nonvolatile memory cells arranged in matrix and formed in said plurality of n type cell wells, each of said nonvolatile memory cells having a memory cell transistor of PMOS transistor with charge accumulation layer;
a plurality of word lines arranged in parallel along with a row direction which is perpendicular to said column direction, to control said plurality of nonvolatile memory cells in a same row; and a plurality of driving circuit units arranged in said column direction, said plurality of driving circuit units corresponding to respective one of said cell wells;
wherein:
each of said driving circuit units has an independent cell well driving circuit to drive corresponding one of said cell wells.

The nonvolatile semiconductor memory of this invention is that each of said driving circuit units has a word line driving circuit to drive corresponding ones of said word lines.

The nonvolatile semiconductor memory of this invention is that each of said driving circuit units has a word line driving circuit to drive corresponding ones of said word lines, said word line driving circuit arranged between said corresponding one of said cell well and said cell well driving circuit.

The nonvolatile semiconductor memory of this invention is that each of said driving circuit units has a word line driving circuit to drive corresponding ones of said word lines and a source line driving circuit to drive sources of said memory cell transistors of PMOS transistors with charge accumulation layers.

(Parallel High Voltage Wires)

A nonvolatile semiconductor memory comprising:
a semiconductor substrate having a p type region;
a plurality of n type cell wells formed in said semiconductor substrate, said n type cell wells being isolated each others and arranged in a column direction;
a plurality of nonvolatile memory cells arranged in matrix and formed in said plurality of n type cell wells, each of said nonvolatile memory cells having a memory cell transistor of PMOS transistor with charge accumulation layer;
a plurality of word lines arranged in parallel along with a row direction which is perpendicular to said column direction, to control said plurality of nonvolatile memory cells in a same row;
a plurality of driving circuit units arranged in said column direction, said plurality of driving circuit units corresponding to respective one of said cell wells;
a high voltage generation circuit for generating at least a first voltage which is higher than Vcc during a programming operation and a second voltage which is also higher than said Vcc during said programming operation;
a first wire arranged in said column direction above said plurality of driving circuit units arranged in said column direction for supplying said first voltage to each of said plurality of driving circuit units; and
a second wire arranged in said column direction above said plurality of driving circuit units arranged in said column direction and arranged in parallel to said first wire, for supplying said second voltage to each of said plurality of driving circuit units.

The nonvolatile semiconductor memory of this invention is that each of said driving circuit units has a word line driving circuit to drive corresponding ones of said word lines and a cell well driving circuit to drive corresponding one of said cell wells, and wherein said word line driving circuit transmits said first voltage to said corresponding one of said word lines with said first voltage during said programming operation and said cell well driving circuit transmits said second voltage to said corresponding one of said cell wells with said second voltage during said programming operation.

The nonvolatile semiconductor memory of this invention further has:
a plurality of bit lines arranged in parallel along with a column direction above said cell wells, each of said bit lines connected to respective one of said plurality of nonvolatile memory cells in a same column; and wherein said plurality of bit lines, said first wire and said second wire are all arranged in parallel and are formed by a same metal layer.

The nonvolatile semiconductor memory of this invention further has:

a plurality of bit lines arranged in parallel along with a column direction above said cell wells, each of said bit lines connected to respective one of said plurality of nonvolatile memory cells in a same column; and wherein said plurality of bit lines, said first wire and said second wire are all arranged in parallel and are formed by a copper layer.

The nonvolatile semiconductor memory of this invention further has:

a plurality of bit lines arranged in parallel along with a column direction above said cell wells, each of said bit lines connected to respective one of said plurality of nonvolatile memory cells in a same column; and wherein said plurality of bit lines, said first wire and said second wire are all arranged in parallel and are formed by a third metal layer.

(Wide GLP Line)

A nonvolatile semiconductor memory comprising:

a semiconductor substrate having a p type region;

a plurality of n type cell wells formed in said semiconductor substrate, said n type cell wells being isolated each others and arranged in a column direction;

a plurality of nonvolatile memory cells arranged in matrix and formed in said plurality of n type cell wells, each of said nonvolatile memory cells having a memory cell transistor of PMOS transistor with charge accumulation layer;

a plurality of word lines arranged in parallel along with a row direction which is perpendicular to said column direction, to control said plurality of nonvolatile memory cells in a same row;

a plurality of bit lines arranged in parallel in said column direction above said cell wells, said bit lines formed by a first metal layer; and a ground line for programming arranged in said row direction, said ground line for programming flowing programming current toward a ground potential, and said ground line for programming formed by a second metal layer;

wherein:

the width of said ground line for programming ($W_{GLP}$) and the width of said bit lines ($W_{MBL}$) satisfy the following condition:

$$2.52 r_R < W_{GPL}/W_{MBL} < 895 r_R$$

$$r_R = R_{GPL}/R_{MBL}$$

where $R_{MBL}$ is a sheet resistance of said bit line and $R_{GPL}$ is a sheet resistance of said ground line for programming and where a number of memory cells arranged in said column direction is not less than 128 and not more than 262,144.

The nonvolatile semiconductor memory of this invention further has:

driving circuit units arranged in said column direction, said plurality of driving circuit units corresponding to respective one of said cell wells, said driving circuit units provide a first voltage which is higher than Vcc during a programming operation to a selected one of said word lines and a second voltage which is also higher than said Vcc during said programming operation to a selected one of said cell wells.

The nonvolatile semiconductor memory of this invention is that said first metal layer and said second metal layer are different layers.

The nonvolatile semiconductor memory of this invention is that said first metal layer and said second metal layer are copper layers.

(Large Driving Transistor)

A nonvolatile semiconductor memory comprising:

a semiconductor substrate having a p type region;

a plurality of n type cell wells formed in said semiconductor substrate, said n type cell wells being isolated each others and arranged in a column direction;

a plurality of nonvolatile memory cells arranged in matrix and formed in said plurality of n type cell wells, each of said nonvolatile memory cells having a memory cell transistor of PMOS transistor with charge accumulation layer;

a plurality of word lines arranged in parallel along with a row direction which is perpendicular to said column direction, to control said plurality of nonvolatile memory cells in a same row;

a plurality of bit lines arranged in parallel in said column direction above said cell wells;

a ground line for programming arranged in said row direction, said ground line for programming flowing programming current toward a ground potential; and a column latch circuit having a plurality of flip flop circuits to store data to be written, each of said flip flop circuits having a first n type MOS transistor, and having a second n type MOS transistor for flowing current from corresponding one of said bit lines toward said ground line for programming, wherein:

the channel width of said first n type MOS transistor ($CW_{N1}$) and the channel width of said second n type MOS transistor ($CWN_2$) satisfy the following condition:

$$1.25 < CW_{N2}/CW_{N1} < 197$$

where a number of memory cells arranged in said column direction is not less than 128 and not more than 262,144.

The nonvolatile semiconductor memory of this invention further has:

driving circuit units arranged in said column direction, said plurality of driving circuit units corresponding to respective one of said cell wells, said driving circuit units provide a first voltage which is higher than Vcc during a programming operation to a selected one of said word lines and a second voltage which is also higher than said Vcc during said programming operation to a selected one of said cell wells.

The nonvolatile semiconductor memory of this invention is that the thickness of a gate insulating layer of said first n type MOS transistor and the thickness of a gate insulating layer of said second n type MOS transistor are substantially equal.

The nonvolatile semiconductor memory of this invention further has:

selection gate transistors connected between corresponding one of said bit lines and corresponding one of sub bit lines, each of said sub bit lines being connected to nonvolatile memory cells arranged in said column direction within corresponding one of said cell well, wherein:

the thickness of a gate insulating layer of said selection gate transistors are greater than the thickness of a gate insulating layer of said first n type MOS transistor and said second n type MOS transistor.

(Column Decoder)

A nonvolatile semiconductor memory comprising:

a semiconductor substrate having a p type region;

a plurality of n type cell wells formed in said semiconductor substrate, said n type cell wells being isolated each others and arranged in a column direction;

a plurality of nonvolatile memory cells arranged in matrix and formed in said plurality of n type cell wells, each of said nonvolatile memory cells having a memory cell transistor of PMOS transistor with charge accumulation layer;

a plurality of word lines arranged in parallel along with a row direction which is perpendicular to said column direction, to control said plurality of nonvolatile memory cells in a same row;

a plurality of bit lines arranged in parallel in said column direction above said cell wells;

a column latch circuit having a plurality of flip flop circuits to store data to be written; and a column decoder circuit arranged between said column latch circuit and said bit lines for selectively connecting and disconnecting respective one of said bit lines to said column latch circuit, wherein:

all of the transistors configuring said column decoder circuit are Vcc MOS transistors and are not high voltage MOS transistors.

The nonvolatile semiconductor memory of this invention is that the column decoder circuit has a plurality of pass gates having an n type MOS transistor and a p type MOS transistors connected in parallel.

The nonvolatile semiconductor memory of this invention is that the column decoder circuit has a plurality of pass gates having an n type MOS transistor and a p type MOS transistors connected in parallel, the gate of said n type MOS transistor connected to a Y selection line and the gate of said p type MOS transistor connected to a /Y selection line which are in parallel to said Y selection line.

The nonvolatile semiconductor memory of this invention is that the column decoder circuit has a plurality of pass gates having an n type MOS transistor and a p type MOS transistors connected in parallel, the gate of said n type MOS transistor connected to a Y selection line made by a metal layer and the gate of said p type MOS transistor connected to a /Y selection line also made by said metal layer which are in parallel to said Y selection line.

The nonvolatile semiconductor memory of this invention is that the column decoder circuit has a plurality of pass gates having an n type MOS transistor and a p type MOS transistors connected in parallel, the gate of said n type MOS transistor connected to a Y selection line made by a metal layer which is in a different layer to said bit lines, and the gate of said p type MOS transistor connected to a /Y selection line also made by said metal layer which are in parallel to said Y selection line.

The nonvolatile semiconductor memory of this invention is that wherein each of the flip flop circuits has a first n type MOS transistor, the column decoder circuit has a plurality of pass gates having an n type MOS transistor and a p type MOS transistors connected in parallel, the gate of said n type MOS transistor connected to a Y selection line and the gate of said p type MOS transistor connected to a /Y selection line which are in parallel to said Y selection line, and that the channel width of said first n type MOS transistor ($CW_{N1}$) and the channel width of said n type MOS transistor of said column decoder ($CWN_2$) satisfy the following condition:

$$1.25 < CW_{N2}/CW_{N1} < 197$$

where a number of memory cells arranged in said column direction is not less than 128 and not more than 262,144.

(Preprogramming)

A nonvolatile semiconductor memory comprising:

a semiconductor substrate having a p type region;

a plurality of n type cell wells formed in said semiconductor substrate, said n type cell wells being isolated each others and arranged in a column direction;

a plurality of nonvolatile memory cells arranged in matrix and formed in said plurality of n type cell wells, each of said nonvolatile memory cells having a memory cell transistor of PMOS transistor with charge accumulation layer;

a plurality of word lines arranged in parallel along with a row direction which is perpendicular to said column direction, to control said plurality of nonvolatile memory cells in a same row;

a plurality of bit lines arranged in parallel in said column direction above said cell wells;

a column latch circuit having a plurality of flip flop circuits to store data to be written; and wherein:

before an erasure operation to said nonvolatile memory cells formed in a selected one of said cell wells, all of said nonvolatile memory cells formed in a selected one of said cell wells are read out and preprogrammed.

(Bit Line Resetting)

A nonvolatile semiconductor memory comprising:

a semiconductor substrate having a p type region;

a plurality of n type cell wells formed in said semiconductor substrate, said n type cell wells being isolated each others and arranged in a column direction;

a plurality of nonvolatile memory cells arranged in matrix and formed in said plurality of n type cell wells, each of said nonvolatile memory cells having a memory cell transistor of PMOS transistor with charge accumulation layer;

a plurality of word lines arranged in parallel along with a row direction which is perpendicular to said column direction, to control said plurality of nonvolatile memory cells in a same row;

a plurality of bit lines arranged in parallel in said column direction above said cell wells; and a column circuit for resetting a level of said bit lines to Vcc in response to a reset signal.

The nonvolatile semiconductor memory of this invention is that the column circuit has a p type transistor connected between corresponding one of said bit lines and Vcc and is in response to said reset signal.

The nonvolatile semiconductor memory of this invention is that the column circuit has a p type transistor connected between corresponding one of said bit lines and Vcc and is in response to said reset signal, and that said reset signal is active when a write command is received.

The nonvolatile semiconductor memory of this invention is that the column circuit has a p type transistor connected between corresponding one of said bit lines and Vcc and is in response to said reset signal, and that said reset signal is active during stand-by.

(FF Resetting)

A nonvolatile semiconductor memory comprising:

a semiconductor substrate having a p type region;

a plurality of n type cell wells formed in said semiconductor substrate, said n type cell wells being isolated each others and arranged in a column direction;

a plurality of nonvolatile memory cells arranged in matrix and formed in said plurality of n type cell wells, each of said nonvolatile memory cells having a memory cell transistor of PMOS transistor with charge accumulation layer;

a plurality of word lines arranged in parallel along with a row direction which is perpendicular to said column direction, to control said plurality of nonvolatile memory cells in a same row;

a plurality of bit lines arranged in parallel in said column direction above said cell wells; and a column latch circuit having a plurality of flip flop circuits for storing data to be written into selected ones of said nonvolatile memory cells, wherein, said plurality of flip flop circuits are reset in response to a power on reset signal for designating that the device is activated.

The nonvolatile semiconductor memory of this invention is that said power on reset signal is supplied from an external source.

(Separate Read Path)

A nonvolatile semiconductor memory comprising:
a semiconductor substrate having a p type region;
a plurality of n type cell wells formed in said semiconductor substrate, said n type cell wells being isolated each others and arranged in a column direction;
a plurality of nonvolatile memory cells arranged in NOR connection matrix and formed in said plurality of n type cell wells, each of said nonvolatile memory cells having a memory cell transistor of PMOS transistor with charge accumulation layer;
a plurality of word lines arranged in parallel along with a row direction which is perpendicular to said column direction, to control said plurality of nonvolatile memory cells in a same row;
a plurality of bit lines arranged in parallel in said column direction above said cell wells;
a column latch circuit having N of flip flop circuits for storing data to be written into selected ones of said nonvolatile memory cells; and
a read path circuit having a M sense amplifiers (M<N) for sensing bit line data.

The nonvolatile semiconductor memory of this invention is that each of said sense amplifiers has Vcc MOS transistors and does not have high voltage MOS transistors.

The nonvolatile semiconductor memory of this invention is that each of said sense amplifiers has first MOS transistors and each of said flip flop circuits has second MOS transistors, the back gate bias of which is substantially the same to the back gate bias of said first MOS transistors.

(Spare Area)

A nonvolatile semiconductor memory comprising:
a semiconductor substrate having a p type region;
a plurality of n type cell wells formed in said semiconductor substrate, said n type cell wells being isolated each others and arranged in a column direction;
a plurality of nonvolatile memory cells arranged in matrix and formed in said plurality of n type cell wells, each of said nonvolatile memory cells having a memory cell transistor of PMOS transistor with charge accumulation layer;
a plurality of word lines arranged in parallel along with a row direction which is perpendicular to said column direction, to control said plurality of nonvolatile memory cells in a same row; and
a plurality of bit lines arranged in parallel in said column direction above said cell wells;
wherein a portion of said plurality of nonvolatile memory cells are assigned to spare area.

The nonvolatile semiconductor memory of this invention is that spare cells for replacing erroneous cells are within said spare area.

(Multi-Bit)

A nonvolatile semiconductor memory comprising:
a semiconductor substrate having a p type region;
a plurality of n type cell wells formed in said semiconductor substrate, said n type cell wells being isolated each others and arranged in a column direction;
a plurality of nonvolatile memory cells arranged in matrix and formed in said plurality of n type cell wells, each of said nonvolatile memory cells having a memory cell transistor of PMOS transistor with charge accumulation layer;
a plurality of word lines arranged in parallel along with a row direction which is perpendicular to said column direction, to control said plurality of nonvolatile memory cells in a same row; and
a plurality of bit lines arranged in parallel in said column direction above said cell wells;
wherein each of said nonvolatile memory cells stores data greater than single bit.

The nonvolatile semiconductor memory of this invention is that at least two flip flop circuits are connected to corresponding one of said bit lines.

The nonvolatile semiconductor memory of this invention is that at least two flip flop circuits are connected to corresponding one of said bit lines and a single reset signal is used to reset said two flip flop circuits.

The nonvolatile semiconductor memory of this invention is that threshold voltages of said nonvolatile memory cells in programmed states are distributed between −dV and Vcc, and that the following condition is met:

$$3.73 < (VCC+d) < 6.22.$$

We claim:

1. A nonvolatile semiconductor memory device comprising:
a semiconductor substrate having a first conductivity type well, wherein a first area and a second area are defined in a surface of the semiconductor substrate, and the surface of the semiconductor substrate is recessed in the second area with respect to the first area thereby a step is formed at the surface of the semiconductor substrate at a boundary of the first area and a second area;
a first oxide layer formed on the semiconductor substrate in the first area;
a nitride layer formed over the first oxide layer, a width of the nitride layer measured along a direction parallel to the surface of the semiconductor substrate in the first area is less than 100 nm;
a second oxide layer formed over the nitride layer;
a polysilicon layer formed over the second oxide layer;
a source region of a second conductivity type formed in the semiconductor substrate in the second area, the second conductivity type being opposite to the first conductivity type; and
an insulating side wall formed on the surface of the semiconductor substrate in the second area and on a second partial area of the polysilicon layer,
wherein:
the insulating side wall fills in the step formed at the surface of the semiconductor substrate at the boundary of the first area and a second area;
the insulating side wall is in contact to both of the first oxide layer and the second oxide layer; and
one end of the nitride layer is surrounded by the first oxide layer, the insulating side wall and the second oxide layer.

2. The nonvolatile semiconductor memory device according to claim 1 wherein a metal silicide layer is formed on a first partial area of the polysilicon layer, the metal silicide layer being made from CoSi.

3. The nonvolatile semiconductor memory device according to claim 1 wherein a top surface of the metal silicide layer is round shaped.

4. The nonvolatile semiconductor memory device according to claim 1 wherein a positive voltage is applied to the source region and a negative voltage is applied to the metal silicide layer during erasure.

5. The nonvolatile semiconductor memory device according to claim 1 wherein the first conductivity type is N type and the second conductivity type is P type.

6. The nonvolatile semiconductor memory device according to claim 1 wherein the step is greater than a thickness of the first oxide layer.

7. The nonvolatile semiconductor memory device according to claim 6 wherein a thickness of the second oxide layer is greater than the thickness of the first oxide layer.

8. The nonvolatile semiconductor memory device according to claim 7 wherein a thickness of the nitride layer is greater than the thickness of the second oxide layer.

9. The nonvolatile semiconductor memory device according to claim 1 further comprising a select gate formed in adjacent to the polysilicon layer, wherein the select gate selectively supplies a bit line potential to the surface of the semiconductor surface under the nitride layer during programming.

10. The nonvolatile semiconductor memory device according to claim 1 wherein the width of the nitride layer measured along the direction parallel to the surface of the semiconductor substrate in the first area is equal to or less than 62 nm.

11. A nonvolatile semiconductor memory device comprising:
word lines;
source lines arranged in parallel; and
a matrix of memory cells,
wherein:
each of the memory cells are formed in a surface of a semiconductor substrate, a first area and a second area are defined in the surface of the semiconductor substrate, and the surface of the semiconductor substrate is recessed in the second area with respect to the first area thereby a step is formed at the surface of the semiconductor substrate at a boundary of the first area and a second area; and
each of the memory cells comprises:
a first oxide layer formed on the semiconductor substrate in the first area;
a nitride layer formed over the first oxide layer, a width of the nitride layer measured along a direction parallel to the surface of the semiconductor substrate in the first area is less than 100 nm;
a second oxide layer formed over the nitride layer;
a polysilicon layer formed over the second oxide layer;
a source region of a second conductivity type formed in the semiconductor substrate, wherein the source region constitute a part of one corresponding source lines; and
an insulating side wall formed on the surface of the semiconductor substrate in the second area and on a second partial area of the polysilicon layer,
wherein:
the insulating side wall fills in the step formed at the surface of the semiconductor substrate at the boundary of the first area and a second area;
the insulating side wall is in contact to both of the first oxide layer and the second oxide layer; and
one end of the nitride layer is surrounded by the first oxide layer, the insulating side wall and the second oxide layer.

12. The nonvolatile semiconductor memory device according to claim 11 wherein a metal silicide layer is formed on a first partial area of the polysilicon layer, the metal silicide layer and the polysilicon layer constitute a part of one corresponding word lines, and the metal silicide layer being made from CoSi.

13. The nonvolatile semiconductor memory device according to claim 11 wherein a top surface of the metal silicide layer is round shaped.

14. The nonvolatile semiconductor memory device according to claim 11 wherein a positive voltage is applied to the corresponding one of the source lines and a negative voltage is applied to the corresponding one of the word lines during erasure.

15. The nonvolatile semiconductor memory device according to claim 11 further comprising a plurality of bit lines arranged perpendicular to the word lines, and select gates, each of the select gates being formed in adjacent to the polysilicon layer, wherein each of the select gate selectively supplies a potential at corresponding one of the bit lines to the surface of the semiconductor surface under the nitride layer during programming.

16. The nonvolatile semiconductor memory device according to claim 15 further comprising a column decode circuit made from Vcc transistors,
wherein:
the Vcc transistors are not high voltage transistors; and
the column decode circuit is connected to the bit lines and selects one of the bit lines in response to a column selection signals.

17. The nonvolatile semiconductor memory device according to claim 16 further comprising a column latch circuit connected to the column decode circuit made from the Vcc transistors, wherein the column latch circuit has a flip flop circuit.

18. The nonvolatile semiconductor memory device according to claim 14 further comprising:
a word line driving circuit for driving a selected one of the word lines; and
a negative charge pump for generating a negative voltage on board, wherein an output of the negative charge pump is connected to the word line driving circuit.

19. The nonvolatile semiconductor memory device according to claim 11 wherein a number of memory cells arranged in a column direction is not less than 128 and not more than 262,144.

20. The nonvolatile semiconductor memory device according to claim 11 wherein the width of the nitride layer measured along the direction parallel to the surface of the semiconductor substrate in the first area is equal to or less than 62 nm.

* * * * *